US012713577B2

(12) United States Patent
Ma et al.

(10) Patent No.: US 12,713,577 B2
(45) Date of Patent: Aug. 18, 2026

(54) STACKED MEMORY STRUCTURE WITH DUAL-CHANNEL TRANSISTOR

(71) Applicant: Intel Corporation, Santa Clara, CA (US)

(72) Inventors: Sean T. Ma, Portland, OR (US); Abhishek A. Sharma, Portland, OR (US); Aaron D. Lilak, Beaverton, OR (US); Hui Jae Yoo, Hillsboro, OR (US); Scott B. Clendenning, Portland, OR (US); Van H. Le, Beaverton, OR (US); Tristan A. Tronic, Aloha, OR (US); Urusa Alaan, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 390 days.

(21) Appl. No.: 17/474,689

(22) Filed: Sep. 14, 2021

(65) Prior Publication Data

US 2023/0081882 A1 Mar. 16, 2023

(51) Int. Cl.
*H10B 12/00* (2023.01)
*G11C 5/10* (2006.01)
*H10D 88/00* (2026.01)

(52) U.S. Cl.
CPC ............... *H10B 12/30* (2023.02); *G11C 5/10* (2013.01); *H10D 88/00* (2025.01)

(58) Field of Classification Search
CPC ........ H10B 12/30; H10B 12/03; H10B 12/05; G11C 5/10; H10D 88/00
USPC .......................................................... 257/296
See application file for complete search history.

(56) References Cited

U.S. PATENT DOCUMENTS

| | | | | |
|---|---|---|---|---|
| 6,074,955 A * | 6/2000 | Lin | H01L 21/76897 | 257/E21.507 |
| 2011/0207303 A1* | 8/2011 | Jeong | H10D 30/0413 | 438/486 |
| 2011/0299328 A1* | 12/2011 | Liu | G01R 33/58 | 365/163 |
| 2013/0037860 A1* | 2/2013 | Jang | H10B 41/10 | 257/E27.081 |
| 2015/0062475 A1* | 3/2015 | Kim | G02F 1/1368 | 257/72 |

(Continued)

OTHER PUBLICATIONS

Extended European Search Report received for EP Application No. 22190238.0, dated Jan. 31, 2023. 8 pages.

(Continued)

*Primary Examiner* — Duy T Nguyen
(74) *Attorney, Agent, or Firm* — Arcane Law PLLC

(57) ABSTRACT

A memory structure includes a spacer between a first side of a wordline conductor and a bitline conductor. A semiconductor material has horizontal portions extending from the bitline conductor along a top and bottom of the wordline conductor and has a contact portion extending along a second side of the wordline conductor between and connecting the horizontal portions. A high-κ dielectric is between the semiconductor material and the wordline conductor. A capacitor has a first conductor, a second conductor, and an insulator between the first and second conductors, where the first conductor contacts the contact portion of the semiconductor material along the first side of the wordline conductor, and the second conductor connects to a ground terminal.

20 Claims, 17 Drawing Sheets

(56) References Cited

U.S. PATENT DOCUMENTS

| | | | | |
|---|---|---|---|---|
| 2015/0348985 | A1* | 12/2015 | Loiko | H10B 43/40 257/314 |
| 2020/0212041 | A1 | 7/2020 | Machkaoutsan et al. | |
| 2020/0279601 | A1* | 9/2020 | Kim | G11C 11/4097 |
| 2021/0202488 | A1 | 7/2021 | Choi | |
| 2021/0257366 | A1* | 8/2021 | Lee | H10B 12/50 |

OTHER PUBLICATIONS

MonolithIC 3D Inc., Monolithic 3D DRAM, http://www.monolithic3d.com/3d-dram.html (accessed Jul. 13, 2021).

A.Prakash et al., "Understanding contact gating in Schottky barrier transistors from 3D channels," Scientific Reports 7:12596, pp. 1-9 (Oct. 3, 2017).

* cited by examiner

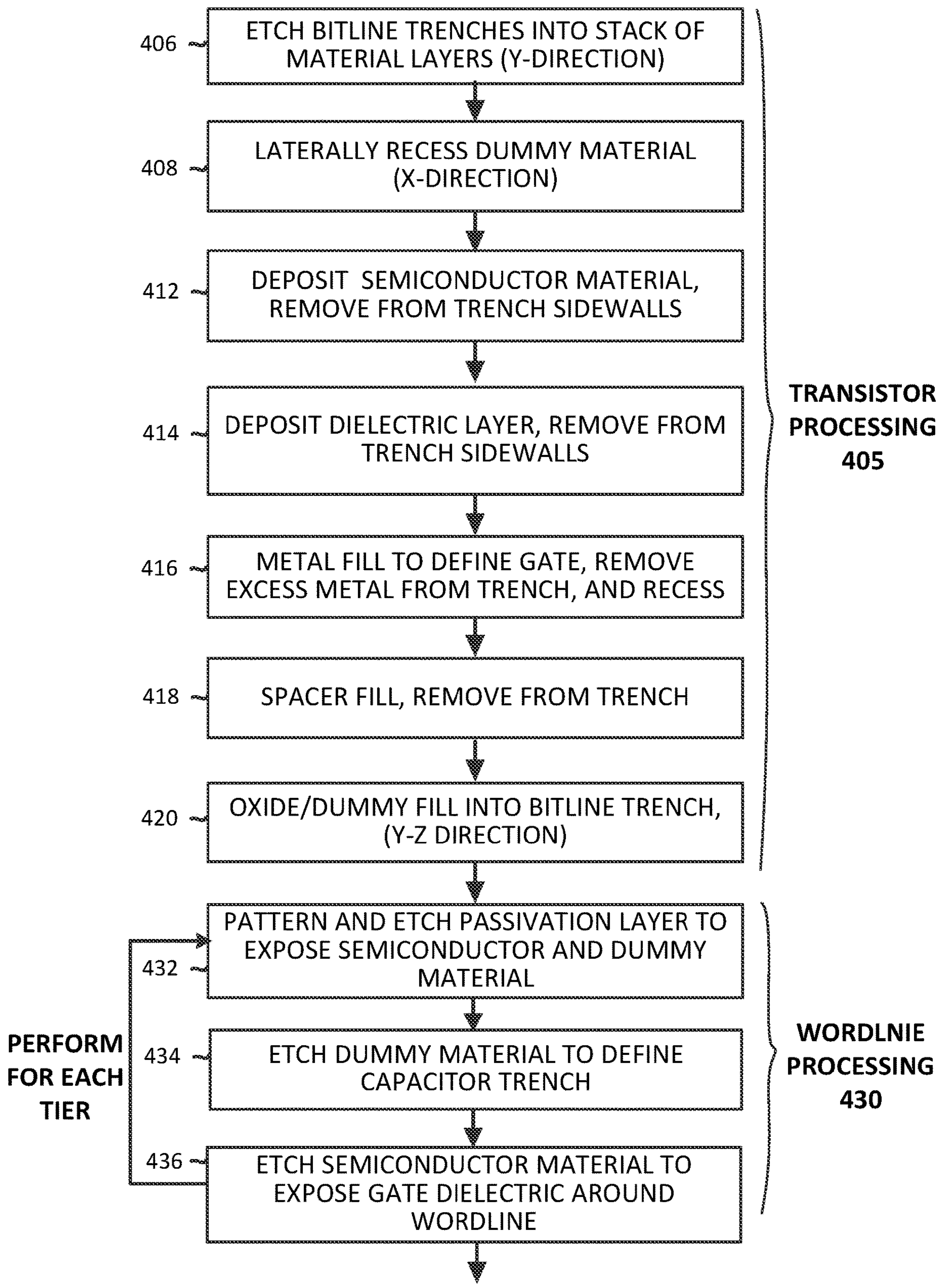

FIG. 4B
406
ETCH BITLINE TRENCHES INTO STACK OF MATERIAL LAYERS (Y-DIRECTION)
408
LATERALLY RECESS DUMMY MATERIAL (X-DIRECTION)
412
DEPOSIT SEMICONDUCTOR MATERIAL, REMOVE FROM TRENCH SIDEWALLS
414
DEPOSIT DIELECTRIC LAYER, REMOVE FROM TRENCH SIDEWALLS
416
METAL FILL TO DEFINE GATE, REMOVE EXCESS METAL FROM TRENCH, AND RECESS
418
SPACER FILL, REMOVE FROM TRENCH
420
OXIDE/DUMMY FILL INTO BITLINE TRENCH, (Y-Z DIRECTION)
TRANSISTOR PROCESSING 405
432
PATTERN AND ETCH PASSIVATION LAYER TO EXPOSE SEMICONDUCTOR AND DUMMY MATERIAL
434
ETCH DUMMY MATERIAL TO DEFINE CAPACITOR TRENCH
436
ETCH SEMICONDUCTOR MATERIAL TO EXPOSE GATE DIELECTRIC AROUND WORDLINE
PERFORM FOR EACH TIER
WORDLNIE PROCESSING 430

STACKED MEMORY STRUCTURE WITH DUAL-CHANNEL TRANSISTOR

FIELD OF THE DISCLOSURE

The present disclosure relates to integrated circuits, and more particularly, to a stacked memory structure having a memory cell configured with a dual-channel transistor.

BACKGROUND

The memory cell is part of an electronic circuit that stores one bit of binary information and is a basic building block of computer memory. Each memory cell can be set to store a logic '1' (high voltage level) and reset to store a logic '0' (low voltage level). The stored logic value is accessed by reading it from the cell, and the value is maintained until it is changed by the set and reset process. Contemporary computer systems primarily use dynamic random access memory (DRAM) cells for the computer's RAM, sometimes referred to as the main memory or graphics memory. Each DRAM memory cell includes one transistor and one capacitor per bit, where the stored value is the charge of the capacitor. The transistor in some DRAM memory structures is a metal-oxide-semiconductor (MOS) field-effect transistor (MOSFET) used along with MOS capacitors. Due to current leakage, the stored value of the memory cell typically must be periodically refreshed (e.g., every 64 milliseconds or less). Because it is becoming increasingly difficult to shrink memory cells any further, some scaling techniques include the use of vertical stacking of memory cells, or so-called three-dimensional (3D) memory structures. There are many non-trivial issues associated with such 3D memory structures.

BRIEF DESCRIPTION OF THE DRAWINGS

FIG. 4B illustrates greater detail of part of the method of FIG. 4A.

Figure 1A:
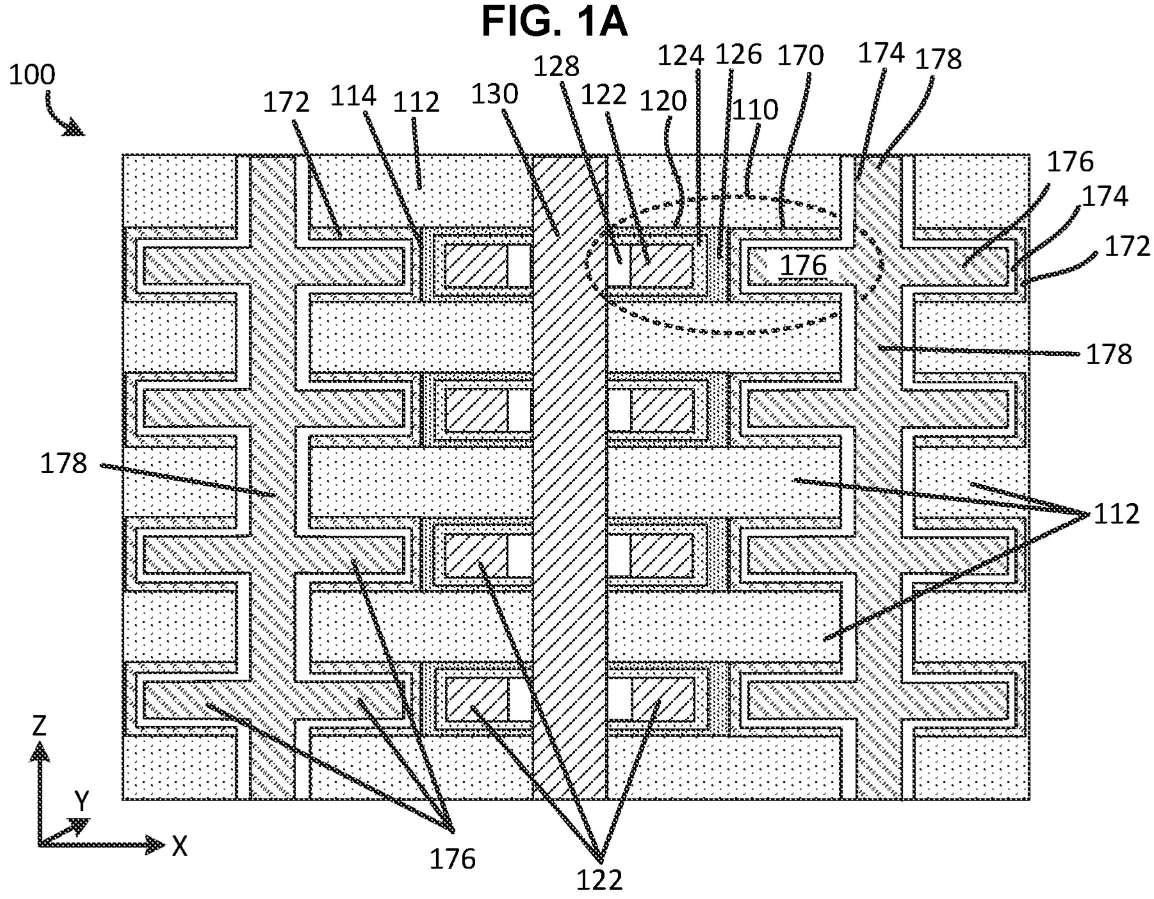
FIG. 1A illustrates a 3D memory structure including stacked tiers of memory cells, in accordance with an embodiment of the present disclosure.

The figures depict various embodiments of the present disclosure for purposes of illustration only. Numerous variations, configurations, and other embodiments will be apparent from the following detailed discussion. Note that the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

The present disclosure is directed to stacked or three-dimensional (3D) memory structures and methodologies to fabricate 3D memory structures, including 3D dynamic random access memory (DRAM) memory structures. In accordance with one embodiment, a 3D memory structure has a multi-tier structure where each tier includes an array of memory cells. The transistors used in the memory cells can be dual-channel thin-film transistors (TFTs), where each TFT has a dual-channel gate that is driven by a wordline, and each TFT abuts a horizontal capacitor to form a 1T-1C memory cell. Transistors in one tier are aligned with transistors in other tiers such that transistors are arranged in a vertical stack. Capacitors are similarly aligned in a vertical fashion. Thus, in some embodiments, metal-insulator-metal (MIM) capacitors are arranged in a vertical stack adjacent a vertical stack of TFTs to provide a vertical stack of horizontal 1T-1C memory cells.

An individual TFT includes a vertical bitline conductor spaced from a first side of a wordline conductor by a spacer. A semiconductor channel material contacts the bitline conductor and has horizontal portions that are vertically spaced apart and extend laterally from the bitline along the top and bottom sides of a wordline conductor. These horizontal portions of channel material provide increased channel area and two pathways for current flow, and hence provide a dual channel. A contact portion of the channel material (e.g., generally oriented vertically) extends between and connects the horizontal portions of the channel material along the second side of the wordline conductor, thus allowing the dual-channel to be gated by the same wordline. A high-κ dielectric is between the channel material and the wordline conductor, according to some embodiments. Laterally adjacent the TFT is a horizontal capacitor with a metal-insulator-metal (MIM) layer structure that provides a gated contact with the contact portion of the channel material. The first conductor of the capacitor abuts the contact portion of the channel material and is spaced from the ground terminal by an insulator.

Compared to memory structures that have a single-channel, such as the case where channel material is only along a top or only along a bottom of the wordline conductor, the dual-channel structure, in which channel material extends along both top and bottom sides of the wordline conductor, provides an increased channel area, and therefore reduced contact resistance.

In some embodiments, MIM capacitors (or storage nodes) of horizontally adjacent memory cells are oriented generally symmetrically in a back-to-back arrangement with respect to a ground terminal extending horizontally between them. Similarly, pairs of TFTs can be arranged symmetrically about a bitline conductor extending vertically between them.

The present disclosure also relates to methodologies for fabricating 3D memory structures (e.g., DRAM memory structure). In one embodiment, each tier of the memory structure uses two material layers of distinct etch selectivity, rather than three. The use of two materials of etch selectivity results in a simplified manufacturing process compared to other processes that require three materials of distinct etch selectivity, as will be appreciated.

General Overview

A previously noted, there are many non-trivial issues associated with 3D memory structures. For instance, fabricating a vertical stack of 1T-1C DRAM memory cells has required extremely complex lithography, alignment, patterning, and etch schemes. Such processing is not only challenging, but also costly. Some such processing uses three material layers of distinct etch selectivity in each tier as the starting point for processing memory cells. However, the availability of three materials of distinct etch selectivity is challenging and processing a three-layer tier is highly complex. Therefore, a need exists for improved methodologies for fabricating 3D memory structures. The present disclosure addresses this need and others by providing fabrication methodologies that use two material layers of distinct etch selectivity in each tier, simplifying the fabrication process.

The present disclosure also provides an efficient memory cell design that can be used in a number of memory applications but is particularly well-suited for stacked or so-called 3D memory structures configured with TFT-based cells. According to some such embodiments, the 3D memory structure is distinct from other memory structures by having one or more of (i) dual-channel TFTs for improved device conductance, (ii) gated contact between the transistor and capacitor at the contact for improved contact resistivity, and (iii) increased contact area at the storage node for reduced contact resistance. These features individually or in combination can be employed, for example, to improve DRAM read/write speeds and performance.

Features of the present disclosure can be detected, for instance, using a two-dimensional cross-sectional TEM cut along the 1T-1C plane to reveal the unique architecture of the memory structure, although other imaging techniques can be used.

Materials that are compositionally different or compositionally distinct as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Also, as discussed herein, terms referencing direction, such as top, bottom, vertical, horizontal, side, left, right, front, back, etc., are used for convenience to describe embodiments of memory structures having a base or substrate extending in a horizontal plane. Embodiments of the present disclosure are not limited by these directional references and it is contemplated that integrated circuits and device structures in accordance with the present disclosure could be used in any orientation.

Example Structures

Figure 1B:
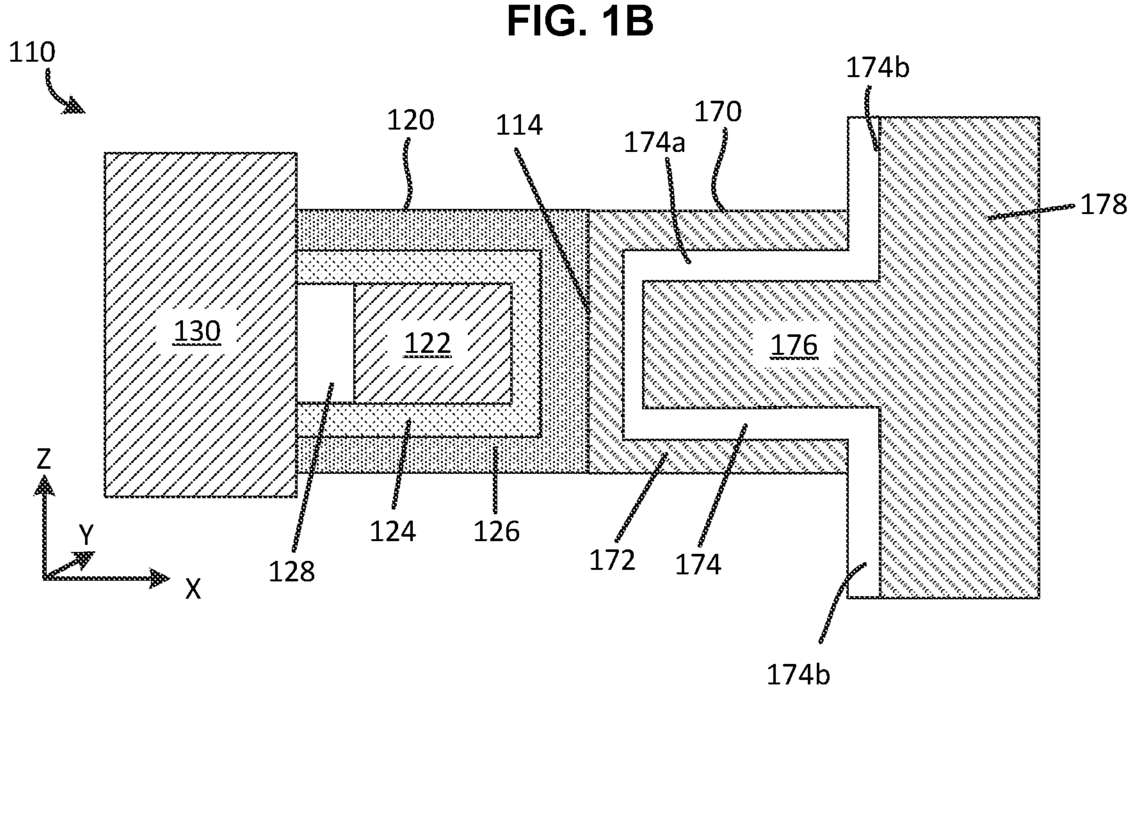
FIG. 1B illustrates an enlarged view of an individual memory cell, such as circled in FIG. 1A, in accordance with an embodiment of the present disclosure.

FIG. 1A illustrates a cross-sectional view of a 3D memory structure 100 with a stacked array of 1T-1C memory cells 110, in accordance with an embodiment of the present disclosure. FIG. 1B illustrates a cross-sectional view of one of the memory cells 110 circled in FIG. 1A. In this example, each memory cell 110 includes a transistor 120 and a capacitor 170.

A wordline conductor 122 extends horizontally in a first direction (e.g., y-direction, into the page). A high-κ dielectric 124 and a layer of semiconductor material 126 extend along a top, a first side, and a bottom of a portion of the wordline conductor 122, where the high-κ dielectric 124 is between the layer of semiconductor material 126 and the wordline conductor 122. A spacer 128 of electrically insulating material (or an electrically insulating air gap) is between an opposite second side of the wordline conductor 122 and a bitline conductor 130 that extends vertically (e.g., a z-direction).

A capacitor 170 is laterally adjacent the first side of the wordline conductor 122 and abuts the layer of semiconductor material 126 at a contact interface 114. The capacitor 170 includes a first conductor 172 abutting the layer semiconductor material 126, a second conductor 176, and a capacitor dielectric 174 between the first and second conductors 172, 176. Note that the first and second conductors 172, 176 may also be referred to as capacitor plates.

In this example, the first conductor 172 is a metal layer having a horizontal U-shape with the closed portion of the U oriented towards the transistor 120 and the open portion of the U oriented away from the transistor. The first conductor 172 can have other shapes, such as a plate or block in contact with the transistor 120. The first conductor 172 is of each capacitor isolated from the first conductor 172 in the capacitor above or below it by capacitor dielectric 174. In this example, the capacitor dielectric 174 includes a horizontal U-shape 174*a* and vertical portions 174*b* connected to the U-shape 174*a*. The capacitor dielectric 174 can have other shapes, depending on the geometry of the first conductor 172, as will be appreciated. Here, the second conductor 176 fills the interior of the horizontal U-shape 174*a* of the capacitor dielectric 174, or otherwise abuts the capacitor dielectric 174, and is continuous with a ground terminal 178 that extends vertically between and connects vertically adjacent capacitors 170.

A passivation material 112, such as an interlayer dielectric (ILD) fills regions between vertically adjacent transistors 120 and between vertically adjacent capacitors. Regions of the passivation material 112 are also positioned horizontally between the bitline conductor 130 and vertical portion 174*b*. As shown in the cross-sectional view of FIG. 1A, for example, individual regions of the passivation material 112 generally have a rectangular shape that extends horizontally over or under a contact interface 114 and portions of the respective transistor 120 and capacitor 170.

The ground terminal 178 is continuous with or otherwise makes electrical contact with the second conductor 176 of individual capacitors 170. A given ground terminal 178 can be electrically connected to the second conductor 176 of capacitors 170 on opposite lateral sides of the ground terminal 178. Such capacitors 170 have a back-to-back arrangement where the second conductor 176 is horizontally aligned and continuous with the ground terminal 178 oriented vertically. Back-to-back capacitors 170 are generally symmetrical about the ground terminal 178, ignoring minor deviations resulting from processing variations. Pairs of back-to-back capacitors 170 are arranged in a vertically spaced-apart stack along the ground terminal 178. Thus, an individual ground terminal 178 can be a common conductor to pairs of back-to-back capacitors 170 located at respective vertical locations along the ground terminal 178, as well as a common conductor to vertically stacked capacitors 170 or pairs of capacitors 170.

In some embodiments, the ground terminal 178 has the same composition and is continuous with the second conductor 176 of individual capacitors 170. For example, a single process may be used to fill metal of the second conductor 176 and ground terminal 178. This condition is not required, and other embodiments can have a ground terminal 178 that is compositionally distinct from the second conductor 176 of the capacitor 170.

As also shown in FIG. 1A, for example, horizontally adjacent transistors 120 are arranged on opposite lateral sides of an individual bitline conductor 130 with symmetrical geometry about the bitline conductor 130, ignoring minor differences resulting from processing variations. In more detail, the bitline conductor 130 is between spacers 128 of adjacent transistors 120, with a wordline conductor 122 on the opposite side of the spacer 128, and where the high-κ dielectric material 124 and layer of semiconductor material 126 extend along the bottom, end, and top sides of the spacer 128 and wordline conductor 122. Thus, an individual bitline conductor 130 can be a conductor that is common to symmetrical pairs of transistors 120 at respective vertical locations along the bitline conductor 130 and can be a conductor that is common to vertically stacked transistors 120.

Figure 2:
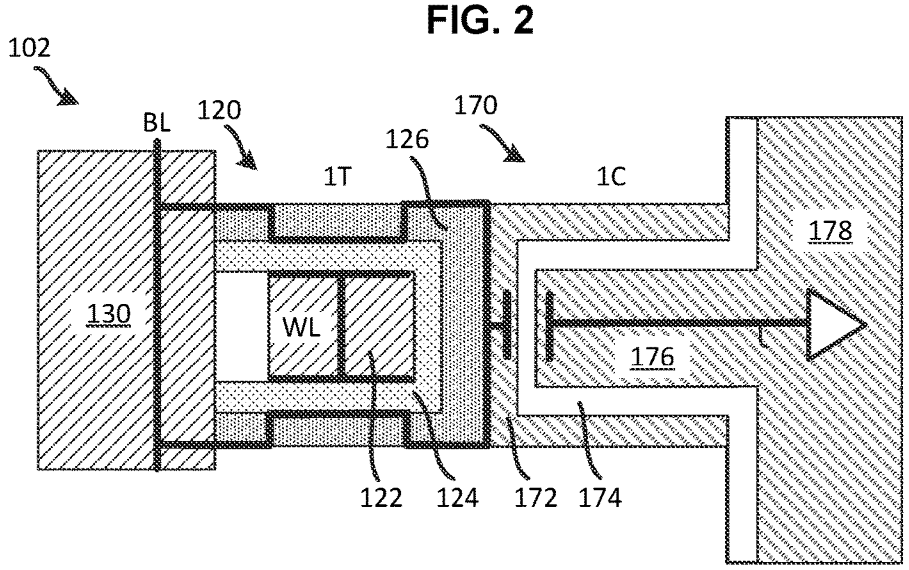
FIG. 2 is a circuit diagram of a 1T-1C memory cell, in accordance with an embodiment of the present disclosure.

FIG. 2 illustrates a circuit diagram superimposed on the 1T-1C memory cell 110 illustrated in FIG. 1B. A bitline conductor 130 is connected to the semiconductor material 126 of the transistor 120, which is spaced from the wordline conductor 122 by the high-κ dielectric material 124 represented as a gap in FIG. 2 (shown in FIG. 1B). The first conductor 172 of the capacitor 170 is connected to the transistor 120, and the second conductor 176 of the capacitor 170 is connected to the ground terminal 178. The gap between the first and second conductors 172, 176 represents the capacitor dielectric 174 shown in FIG. 1B.

Figure 3:
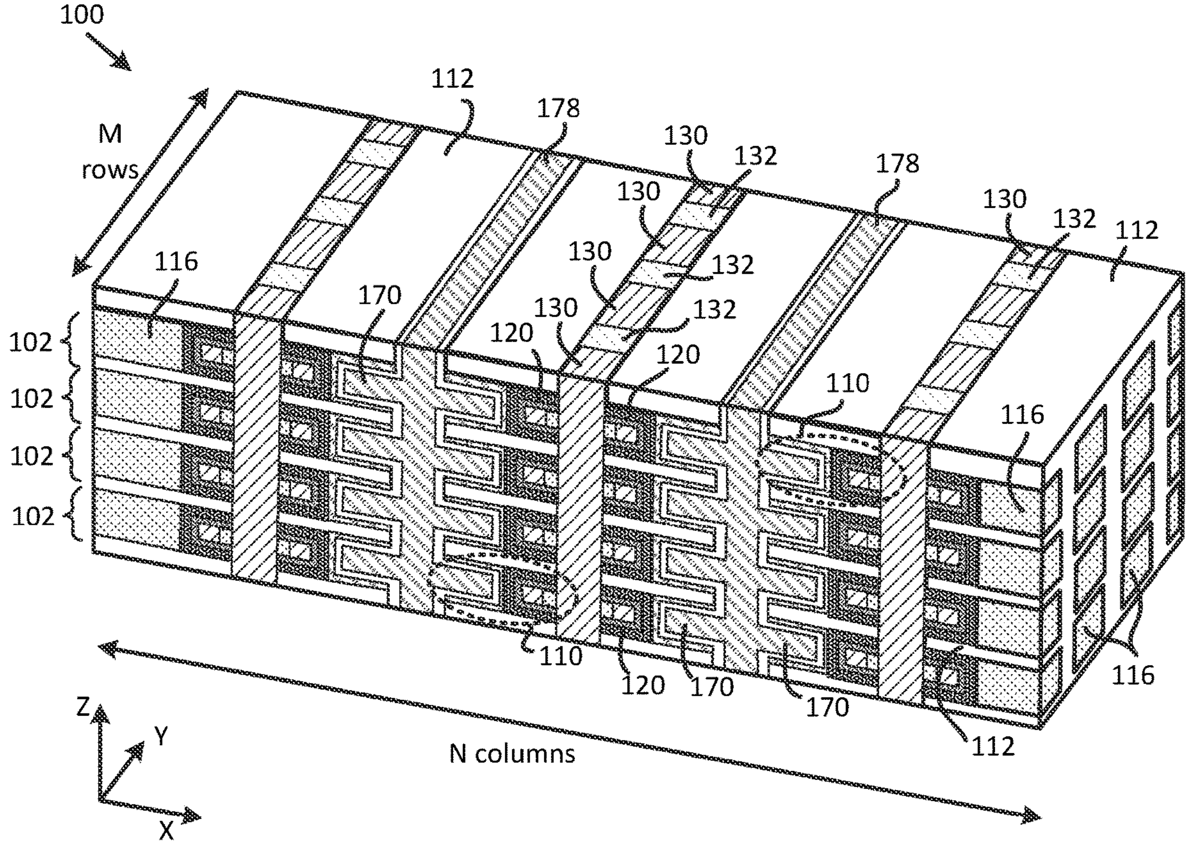
FIG. 3 is a perspective view of a 3D memory structure with multiple tiers of memory cells, in accordance with an embodiment of the present disclosure.

Referring now to FIG. 3, an isometric view shows an example of a 3D memory structure 100, in accordance with an embodiment of the present disclosure. The memory structure 100 includes a plurality of tiers 102 of memory cells 110 stacked vertically in a Z-axis direction, where an individual tier 102 has a rectangular N×M array of memory cells 110. The memory structure 100 is not limited to four tiers 102 as shown and can have 8, 16, 32, 64 or some other number of tiers 102.

In each tier 102, N memory cells 110 are arranged in rows along a first horizontal direction (e.g., along an X-axis) and M memory cells arranged in a column along a second horizontal direction orthogonal to the first horizontal direction (e.g., along a Y-axis), wherein N and M are whole numbers equal to two or more. Passivation material 112 is between memory cells 110 in adjacent tiers 102 and between memory cells 110 in adjacent rows. In some embodiments, dummy material 116 remains at ends of the memory structure 100 adjacent a transistor 120 or capacitor 170.

Bitline conductors 130 extend vertically through the memory structure 100 and are spaced from one another along the Y-axis by a bitline spacer 132 of oxide or other suitable insulating material, including an air gap. Individual bitline conductors 130 are common to pairs of transistors 120 on opposite lateral sides of the bitline conductor 130 (along the X axis) and common to such pairs of transistors 120 in a vertical stack. Thus, in the example shown in FIG. 3, an individual bitline conductor 130 is common to eight transistors 120. Note that the memory structure 100 is not limited to the quantities of memory cells or to the particular geometry shown in this example.

Ground terminals 178 of capacitors 170 extend part way or all the way through the memory structure 100 in a vertical direction (e.g., along the Z-axis) to connect some or all capacitors 170 vertically arranged in tiers 102. The ground terminals 178 also extend all or part way through the memory structure 100 along the Y-axis (second horizontal direction) to connect some or all capacitors 170 along a given row. For each tier 102, individual ground terminals 178 are common to two rows of capacitors 170 extending in the Y-direction, the rows on opposite sides of the ground terminal 178 (in the X-direction). Further, an individual ground terminal 178 is common to such rows of capacitors 170 in each tier of the vertical stack. Thus, in the example shown in FIG. 3, an individual ground terminal 178 is common to thirty-two capacitors 170, eight per tier 102. As such, an individual ground terminal 178 can generally have a geometry that includes a flat plate extending vertically and horizontally through the memory structure 100.

In one embodiment, the memory structure 100 includes a first plurality of capacitors 170 spaced vertically along a first side of a vertical ground terminal 178 and a second plurality of capacitors 170 spaced vertically along a second side of the vertical ground terminal 178, where the vertical ground terminal 178 is between and connects the second conductor 176 of horizontally adjacent capacitors 170 of the first and second pluralities of capacitors 170. The memory structure 100 also includes a first plurality of transistors 120 spaced vertically along a first side of a bitline conductor 130 and a second plurality of transistors 120 spaced vertically along a second side of the bitline conductor 130, where the bitline conductor 130 is spaced from the transistor's metal gate (i.e., wordline conductor 122) by spacer 128, and is between the spacer, the insulator, and the semiconductor of horizontally adjacent transistors of the first and second pluralities of transistors. In some such embodiments, pairs of capacitors 170 have a substantially symmetrical geometry about the ground terminal 178 and pairs of transistors 120 have a substantially symmetrical geometry about the bitline conductor 130, accounting for deviations from true symmetry that result from process variations, imperfections, and the like. Similarly, the first and second pluralities of capacitors 170 can have a substantially symmetrical geometry about the ground terminal 178 and the first and second pluralities of transistors 120 can have a substantially symmetrical geometry about the bitline conductor 130.

The semiconductor material 126 typically has a thickness from 0.5 nm to 10 nm and can be an amorphous, polycrystalline, or crystalline, including but not limited to silicon, germanium, silicon germanium (SiGe), gallium arsenide (GaAs), indium antimonide (InSb), indium gallium arsenide (InGaAs), gallium antimonide (GaSb), tin oxide ($SnO_2$), indium gallium oxide (InGaO), and indium gallium zinc oxide (InGaZnO or IGZO). The semiconductor material 126 can also be an amorphous, polycrystalline, or crystalline 2D material, transition metal dichalcogenide, or 2D alloy, including but not limited to molybdenum disulfide ($MoS_2$), tungsten disulfide ($WS_2$), graphene, graphene oxide, silicene, silica glass, germanene, stantene, phosphorene, and boron.

The passivation material 112 typically has a thickness from 3 nm to 20 nm and can be one or more insulating or low-κ dielectric materials, such as aluminum oxide, gallium oxide, silicon nitride (e.g., $Si_3N_4$), silicon dioxide (Sift), silicon carbide nitride (SiCN), titanium dioxide ($TiO_2$), hafnium dioxide, silicon oxynitride, aluminum silicate, tantalum oxide, hafnium tantalum oxide, aluminum nitride, aluminum silicon nitride, silicon aluminum oxynitride (SiAlON), zirconium dioxide, hafnium zirconium oxide, tantalum silicate, and hafnium silicate, to name a few examples.

The spacer 128 typically has a thickness from 5 nm to 10 nm and can be formed of any suitable low-κ material, such as porous silicon dioxide, amorphous carbon, spin-on glass, silicon oxycarbides (SiOCH), fluorine-doped $SiO_2$, carbon-doped $SiO_2$, silsesquioxanes, carbon-doped oxide, silicon nitride, silicon oxide, silicon oxynitride or other carbides or nitrides (e.g., silicon carbide, silicon nitride doped with carbon, and silicon oxynitride). In some embodiments, spacer 128 can be or can include an air gap.

The high-κ dielectric 124 typically has a thickness of 1 nm to 5 nm. As used herein, the term high-κ refers to materials having a dielectric constant greater than that of silicon dioxide ($SiO_2$). The high-κ dielectric 124 can be hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or other suitable high-κ dielectric material. Note that the stoichiometry of such high-κ dielectric compounds and other example materials provided herein may vary from one embodiment to the next, and such compounds represented without stoichiometric coefficients or values are intended to represent all forms of that compound or material.

The first and second conductors 172, 176 of the capacitors 170 and the vertical ground terminal 178 can be any suitable conductive material including but not limited to copper, cobalt, tungsten, titanium, aluminum, or ruthenium, to name a few examples. The capacitor dielectric 174 can include any of the materials discussed above with reference to the high-κ dielectric 124. The layer thickness of the first and second conductors 172, 176 and the capacitor dielectric 174 is typically from 1 nm to 5 nm.

Figure 4A:
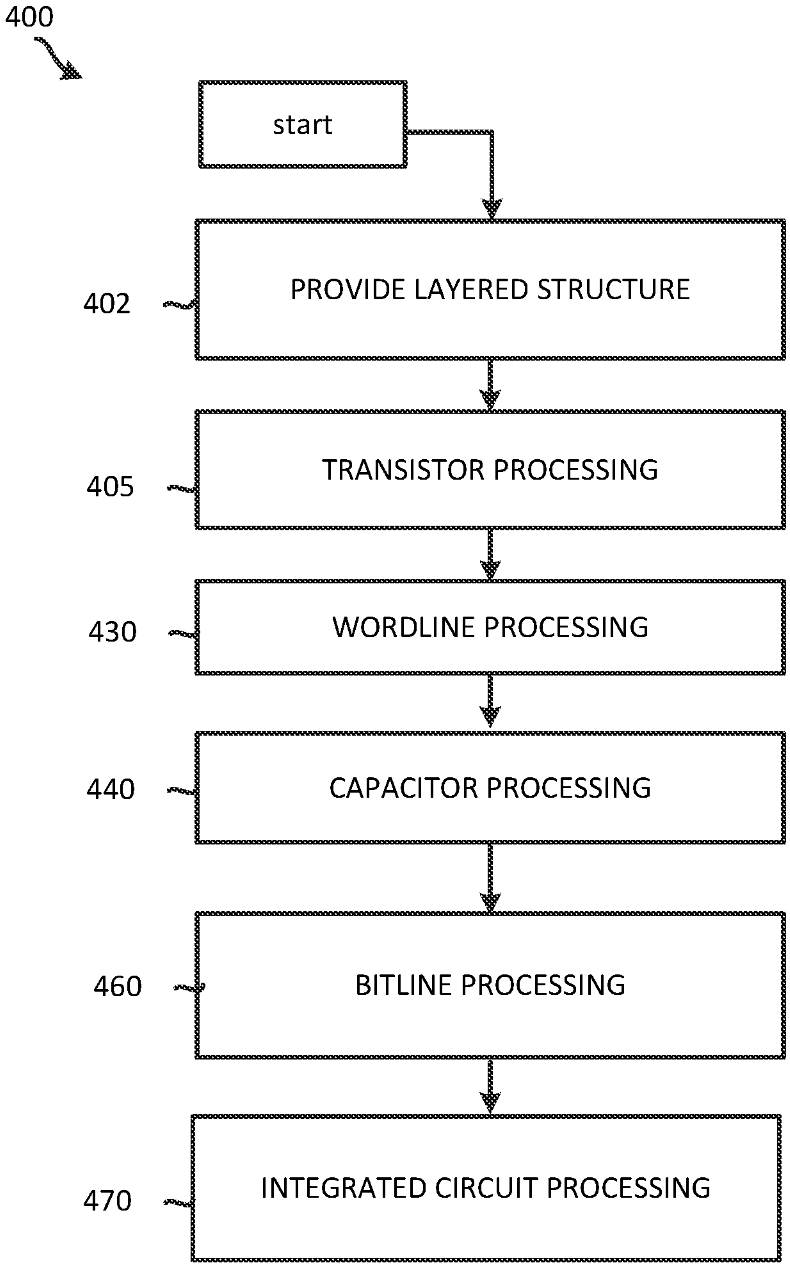
FIG. 4A illustrates a method of fabricating a 3D memory structure, in accordance with an embodiment of the present disclosure.
Figure 4C:
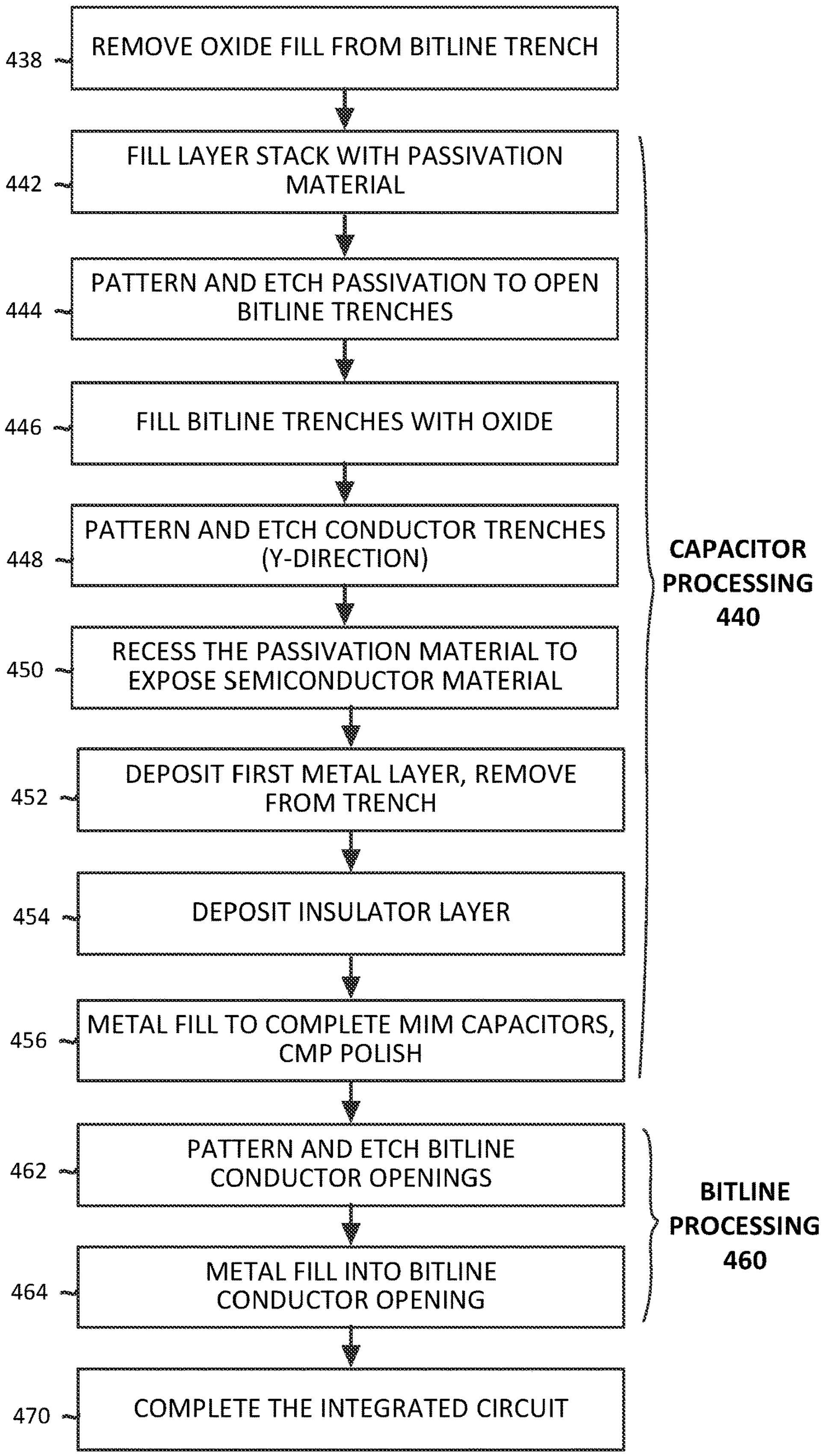
FIG. 4C illustrates greater detail of part of the method of FIG. 4A.

Referring now to FIG. 4A, flow chart illustrates a method 400 of fabricating a 3D memory structure, in accordance with an embodiment of the present disclosure. FIG. 4A identifies major processes in method 400, where details of sub-processes are shown in more detail in FIGS. 4B-4C. Example structures at various stages of method 400 are shown in FIGS. 5-32 and are discussed below along with processes in method 400. Note that the processes in method 400 are shown in a particular order for ease of description. However, one or more of the processes may be performed in a different order or may not be performed at all (and thus be optional), in accordance with some embodiments. For example, transistor processing 405 is shown and discussed as being performed prior to capacitor processing 440. However, in some embodiments of method 400, capacitor processing 440 precedes transistor processing 405.

Processes in method 400 can be performed using any suitable techniques, including but not limited to, masking, patterning, lithography, and/or etching processes (e.g., wet and/or dry etching). Etch processing may include one or more of chemical wet or dry etch, reactive ion etch (ME), deep reactive ion etch (DRIE), fast atom beam etch (FAB), and plasma etch (PE) to name a few examples. Material can be deposited using any suitable process, including atomic layer deposition (ALD), chemical vapor deposition (CVD), physical vapor deposition (PVD), epitaxial growth, or combinations of these processes, to name a few examples. In some embodiments, the structure can be planarized using chemical-mechanical polishing (CMP). Numerous variations on method 400 and the techniques described herein will be apparent in light of this disclosure.

In accordance with one embodiment, method 400 begins with providing 402 a layered stack of alternating layers of passivation material and dummy material, where the passivation material and dummy material are selected for etch selectivity. The dummy material 116 and passivation material 112 can be deposited using blanket deposition techniques. Each layer pair of passivation material and dummy material identifies a tier of the memory structure to be fabricated. The passivation material and dummy material can be selected from materials discussed above for the layer of passivation material 112 and low-κ spacer 128.

Figure 5:
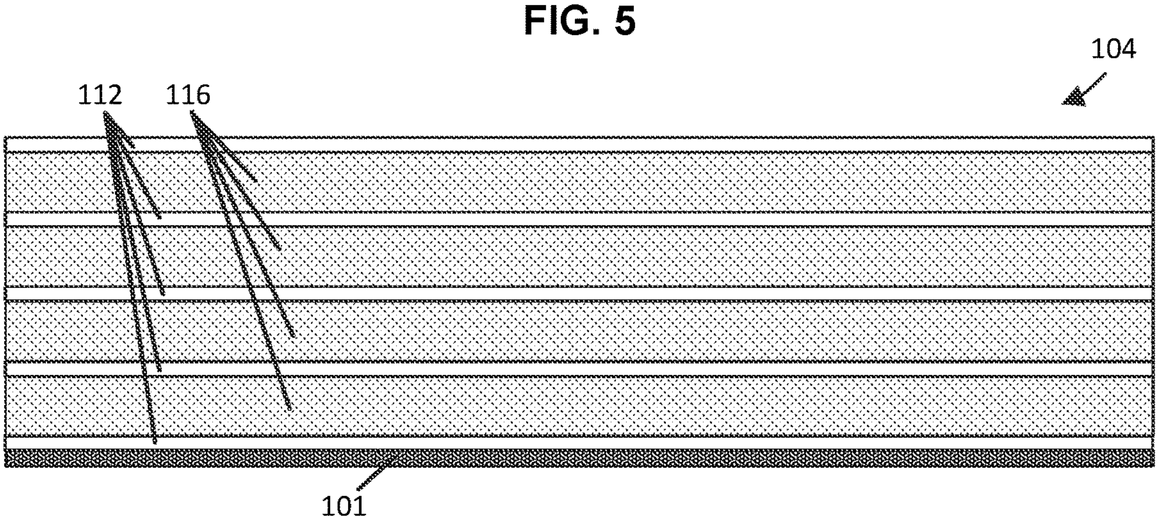
FIG. 5 illustrates a cross-section view of a multi-tier layer stack provided in preparation for fabricating a 3D memory structure, in accordance with an embodiment of the present disclosure.

FIG. 5 illustrates a cross-section view of a layer stack 104, in accordance with one embodiment. The layer stack 104 includes alternating layers of passivation material 112 and dummy material 116. In some embodiments, each layer of passivation material 112 and dummy material 116 has a layer thickness from 5 nm to 20 nm. In one particular example, the passivation material 112 has a thickness of about 5 nm and the dummy material 116 has a thickness form 15 nm to 20 nm. In one example, the passivation material 112 is a nitride, such as silicon nitride ($Si_3N_4$), and the dummy material 116 polysilicon or silicon dioxide. The layer stack 104 can include at least four layers or tiers 102, such as from eight to thirty-two or more tiers 102 or other number of tiers 102 as deemed suitable for a given process.

The layer stack 104 can be formed on a base 101. In some embodiments, the base 101 is a bulk wafer, such as monocrystalline silicon, germanium, silicon carbide (SiC), gallium nitride (GaN), and gallium arsenide (GaAs) to name a few examples. The semiconductor material can be selected in some embodiments from group III-V materials and/or group IV materials. Further, the base 101 can comprise a semiconductor layer deposited or grown on, or transferred to, a structural substrate, such as silicon carbide layer epitaxially grown on a sapphire substrate. Base 101, in some embodiments may include a semiconductor on insulator (SOI) structure where an insulator/dielectric material (e.g., an oxide material, such as silicon dioxide) is sandwiched between two semiconductor layers, such as in a buried oxide (BOX) structure. For example, in some such embodiments the SOI structure includes a silicon dioxide layer on a bulk silicon wafer, and a top layer on the silicon dioxide layer is monocrystalline silicon. As will be appreciated, the thickness of the base 101 (or the semiconductor layer(s) of the base 101, as the case may be) can be any thickness suitable for the devices to be fabricated thereon.

Method 400 continues with transistor processing 405, including etching the layered stack to define bitline trenches extending vertically through and in a Y-axis direction through the stack, defining the location of transistors in each tier of the layered stack, and depositing materials to define a transistor in the defined locations. Details of transistor processing 405 and wordline processing 430 are discussed in more detail with reference to FIG. 4B. After completing the transistor processing 405 and wordline processing 430, capacitor processing 440 and bitline processing 460 can be performed, optionally followed by further processing 470 as needed to complete an integrated circuit. Capacitor processing 440 and bitline processing 460 are discussed in more detail with reference to FIG. 4C.

Figure 6:
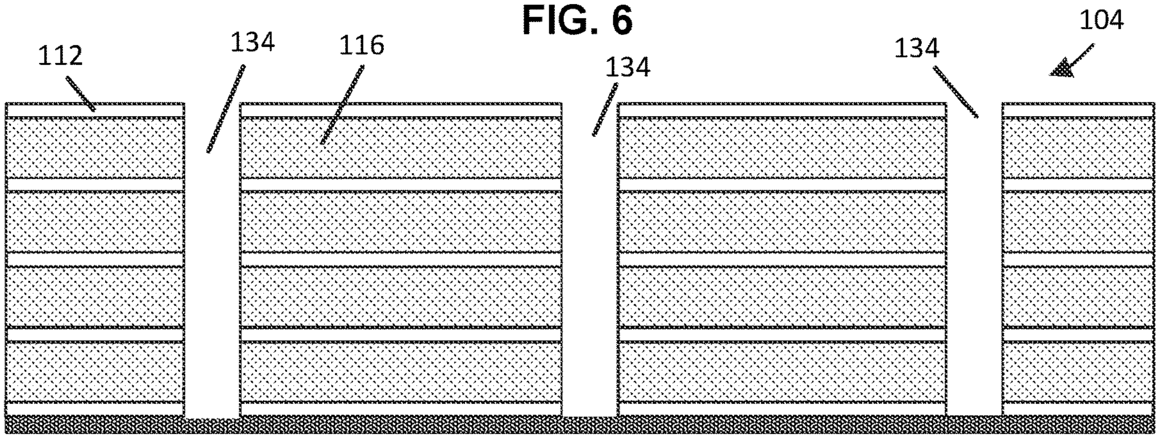
FIG. 6 illustrates the layer stack of FIG. 5 after processing bitline trenches, in accordance with an embodiment of the present disclosure.

Referring to FIG. 4B, transistor processing 405 begins with etching 406 bitline trenches into the layer stack, where bitline trenches extend vertically down into the layer stack as well as in a Y-axis direction through the layer stack. Etching 406 bitline trenches can be performed using an anisotropic etch process, such as an ion etch. FIG. 6 illustrates the layer stack 104 after etching the bitline trenches.

Figure 7:
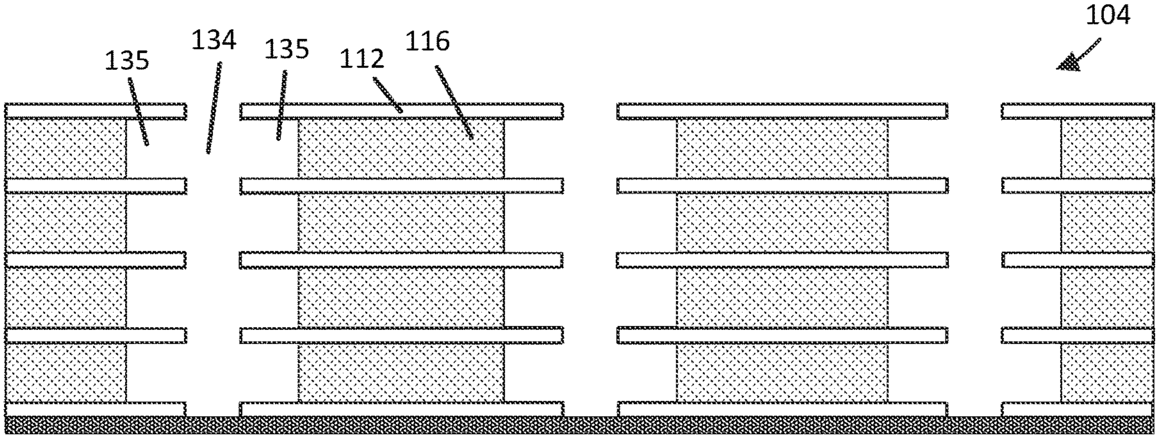
FIG. 7 illustrates the layer stack of FIG. 6 after recessing dummy material in preparation for processing transistors, in accordance with an embodiment of the present disclosure.

Next, the dummy material 116 is recessed 408 laterally to define recesses 135 for transistors. Recessing 408 the dummy material 116 can be performed, for example, using an isotropic wet or dry chemical etch that is selective to the passivation material 112 and removes the dummy material 116. FIG. 7 illustrates the layer stack 104 of FIG. 6 after recessing 408 the dummy material 116.

Figure 8:
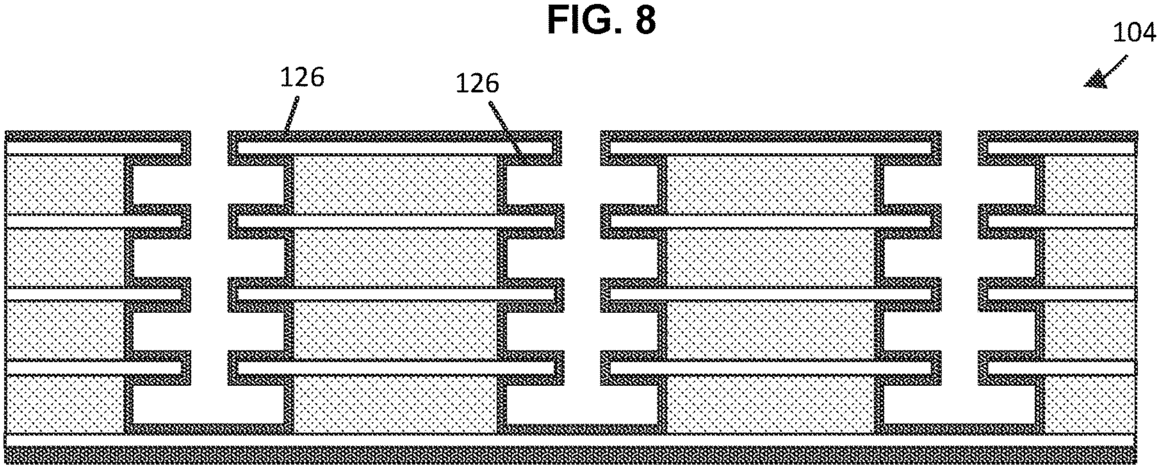
FIGS. 8-10 illustrate the layer stack of FIG. 7 after processing to deposit a layer of semiconductor material and dielectric material of transistor structures, in accordance with some embodiments of the present disclosure.
Figure 9:
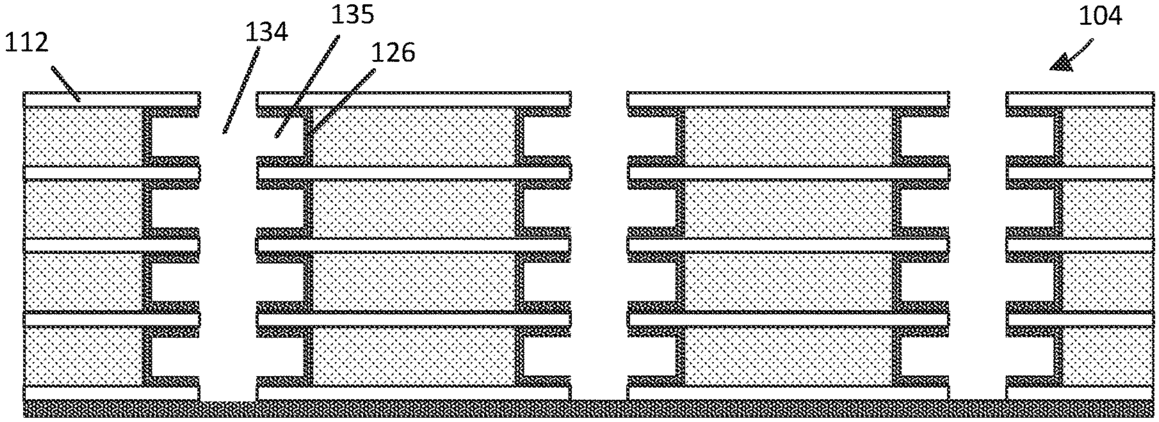

Transistor processing 405 continues with depositing 412 a layer of semiconductor material. Depositing 412 can be performed using atomic layer deposition or other suitable process so that the semiconductor material has a generally uniform thickness on exposed surfaces. FIG. 8 illustrates the layer stack 104 of FIG. 7 after depositing 412 the semiconductor material 126. Next, the semiconductor material 126 is removed from the top passivation material and sidewalls of the bitline trench 134, such as shown in FIG. 9. Removing the semiconductor material 126 can be performed using an anisotropic etch. Semiconductor material 126 can alternately or additionally removed from the top layer of passivation material 112 using chemical-mechanical polishing. Note in the example of FIG. 9 that the semiconductor material 126 lines the top, side, and bottom surface of recesses 135, but has been removed from the bitline trench 134.

Figure 10:
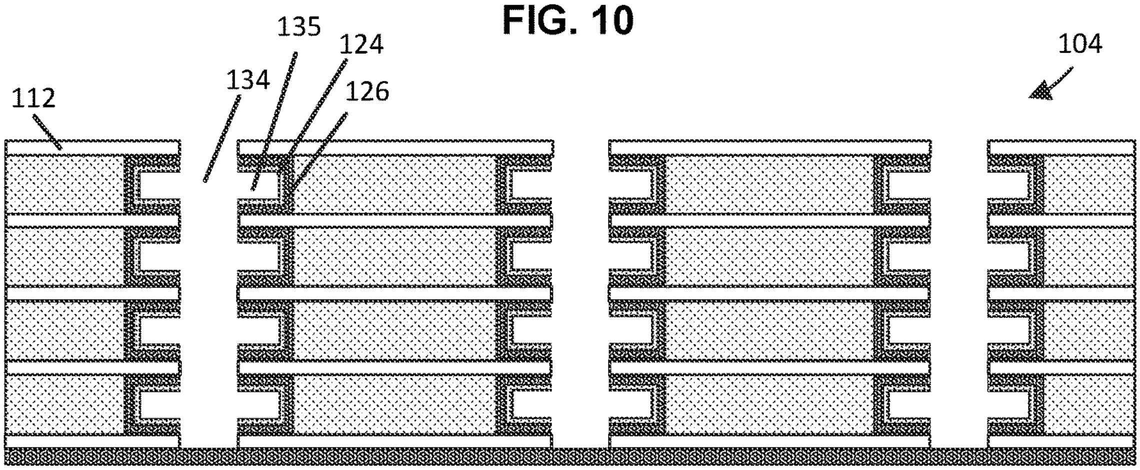

Transistor processing 405 continues with depositing 414 a layer of high-κ dielectric material on the semiconductor material in the recesses 135. Depositing 414 can be performed using atomic layer deposition or other suitable process so that the semiconductor material has a generally uniform thickness on exposed surfaces. FIG. 8 illustrates the layer stack 104 of FIG. 7 after depositing 414 the semiconductor material 126. Next, the deposited high-κ dielectric material is removed from the top passivation material and sidewalls of the bitline trench 134. FIG. 10 illustrates the layer stack 104 of FIG. 9 after depositing 414 high-κ dielectric material 124 on the semiconductor material 126 in the bitline trenches 134.

Figure 11:
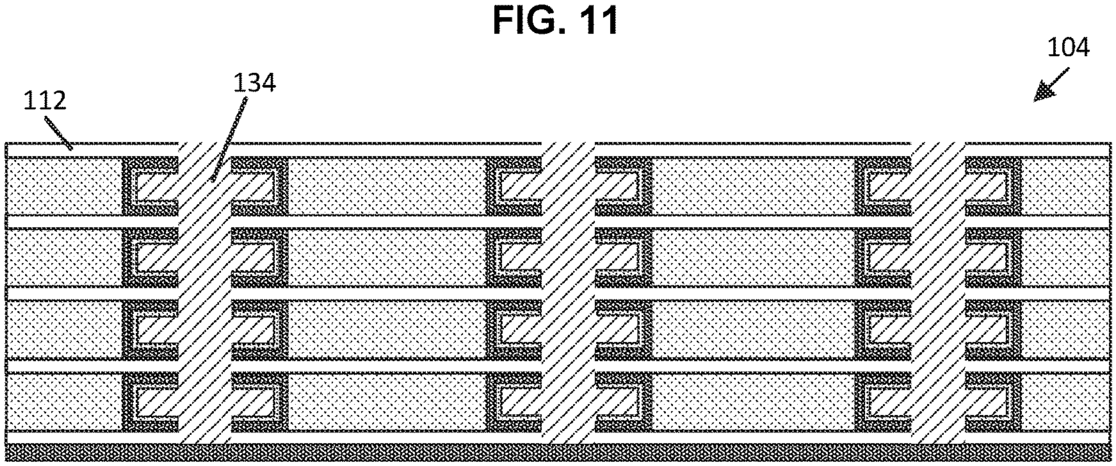
FIGS. 11-13 illustrate the layer stack of FIG. 10 after various stages of processing wordline conductors and spacer material, in accordance with some embodiments of the present disclosure.
Figure 12:
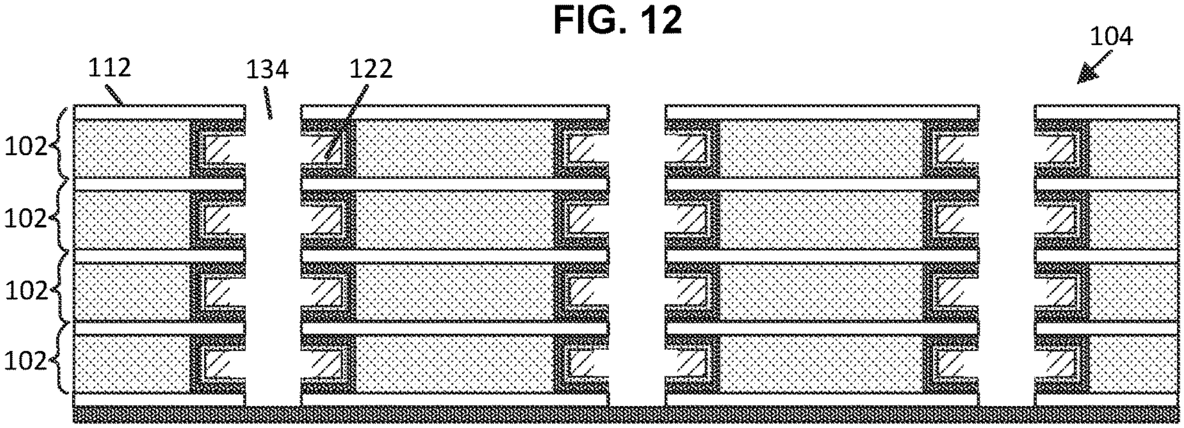
Figure 13:
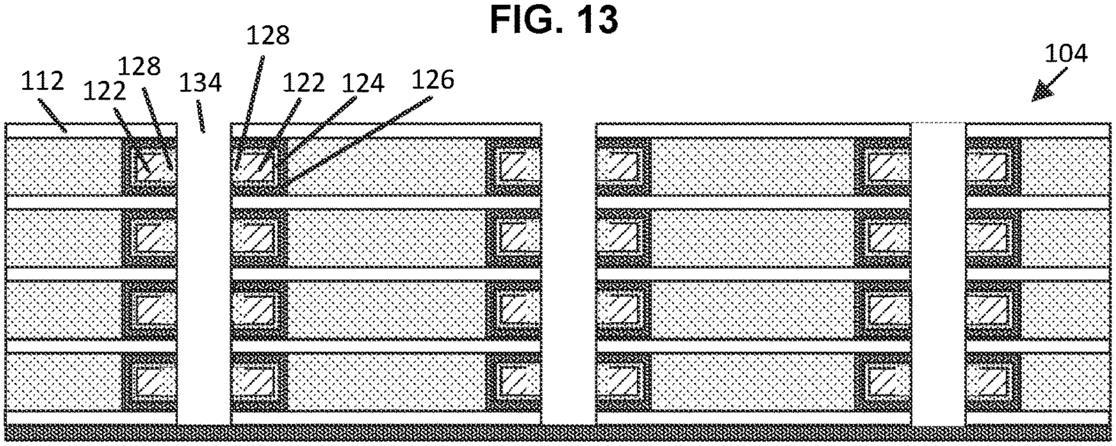

Transistor processing 405 continues with 416 filling the bitline trenches 134 with metal or other conductor and processing the metal fill to define the wordline conductors 122 extending along the Y-axis between transistors in a column within each tier 102. FIG. 11 illustrates the layer stack 104 after depositing metal in the bitline trenches 134 using, for example, vapor deposition. In FIG. 12, the metal is then removed from the top layer of passivation material 112 and from the bitline trench 134. The metal has also been partially recessed laterally, resulting in wordline conductors 122 in contact with the high-κ dielectric and extending horizontally in a Y-axis direction (into the page as shown in FIG. 12) between transistors in a given column of each tier 102.

Transistor processing 405 continues with depositing low-κ spacer material 128 in the bitline trenches 134 and recess of the wordline conductor 122, then removing the low-κ spacer material 128 from the bitline trenches 134 using an anisotropic etch. As shown, for example, in FIG. 13, the low-κ spacer material 128 abuts the wordline conductor 122. At this stage of transistor processing 405, the layer stack 104 has a transistor structure that includes a wordline conductor 122 wrapped on three sides with a high-κ dielectric material 124 and a layer of semiconductor material 126, where the high-κ dielectric is between the wordline conductor 122 and the semiconductor material 126. In other embodiments where the spacer 128 comprises an air gap, the air gap can be closed by metal fill in the bitline trench 134. Alternately, an air gap can be formed by using a wet etch process that removes or partially removes the exposed bitline spacer from the top, and removes the exposed gate spacer from the side, where the wet etch is performed after the bitline conductor is formed, such as discussed below in process 464.

Figure 14A:
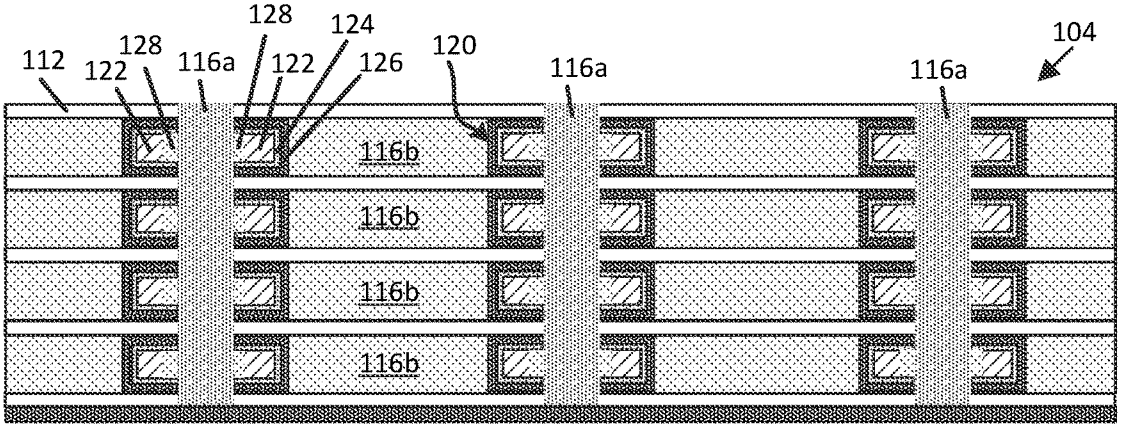
FIGS. 14A and 14B illustrate cross-section and perspective views, respectively, of a layer stack after processing transistor structures, in accordance with an embodiment of the present disclosure.
Figure 14B:
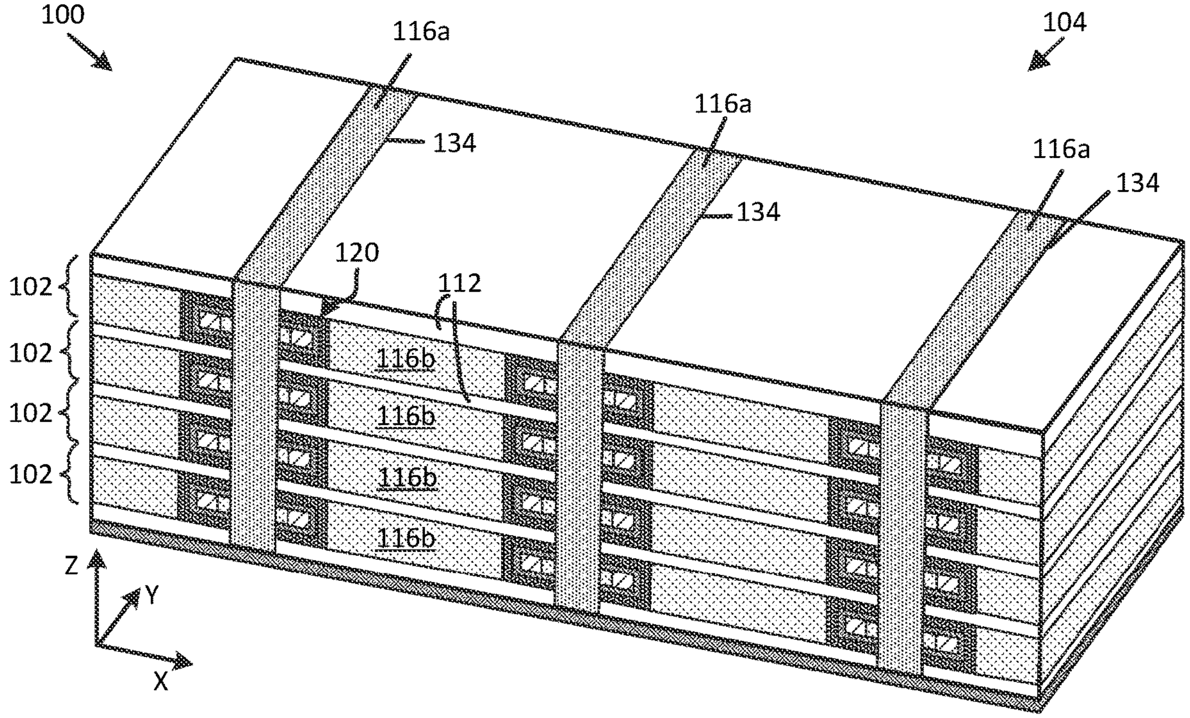

In this example, method 400 proceeds with wordline processing 430 and then capacitor processing 440. To preserve the transistor structure during subsequent wordline processing 430 and capacitor processing 440, the bitline trench 134 can be filled 420 with a dummy material 116*a*, such as an oxide. Dummy material 116*a* can be, but does not have to be, compositionally distinct from dummy material 116*b* in the layer stack 104 so as to provide etch selectivity. FIGS. 14A and 14B illustrate a cross-section view and a perspective view of an example of layer stack 104 after filling the bitline trenches 134 with dummy material 116*a*, where the dummy material 116*a* occupies the space of a bitline conductor 130 and is spaced from the wordline conductor 122 by the low-κ spacer 128. In the perspective view of FIG. 14B, the dummy material 116*a* in the bitline trenches extends in a Y-axis direction through the layer stack 104. The transistors 120 are isolated by dummy material 116*a* in the bitline trench 134 as well as by dummy material 116*b* positioned laterally to each transistor 120, in addition to passivation material 112 above and below each transistor 120.

Figure 15A:
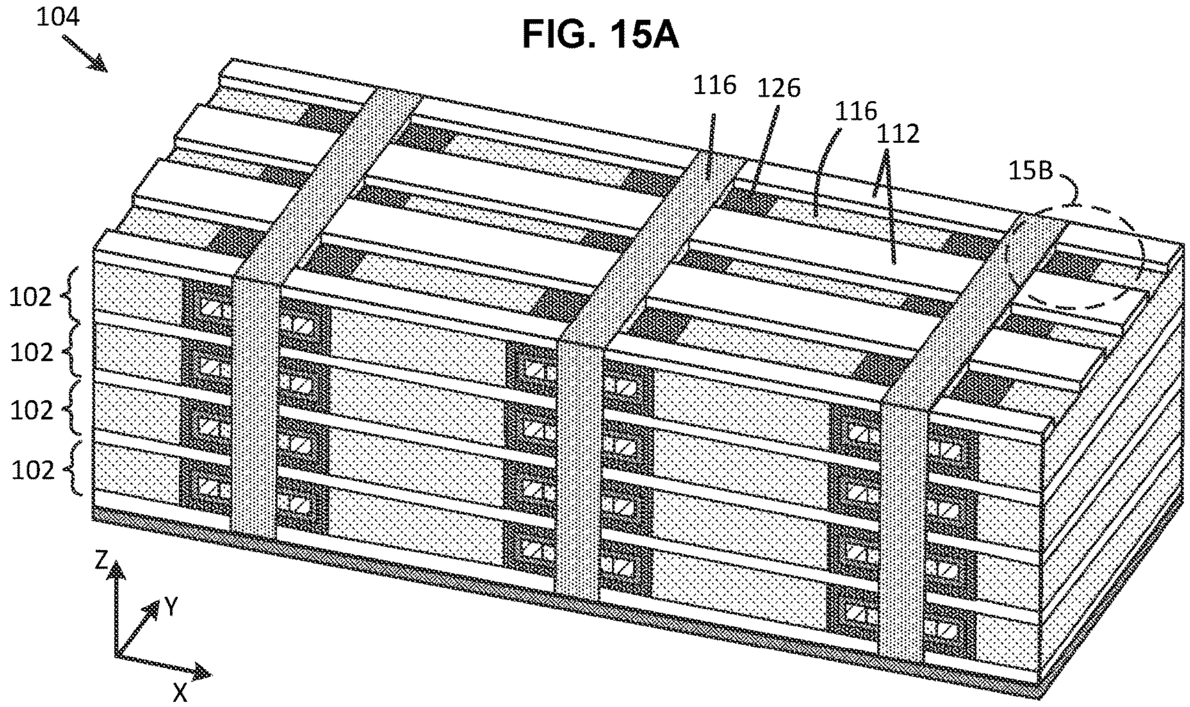
FIG. 15A illustrates the layer stack of FIGS. 14A-14B after processing to define openings in the top layer of passivation material in preparation for capacitor processing, in accordance with an embodiment of the present disclosure.
Figure 15B:
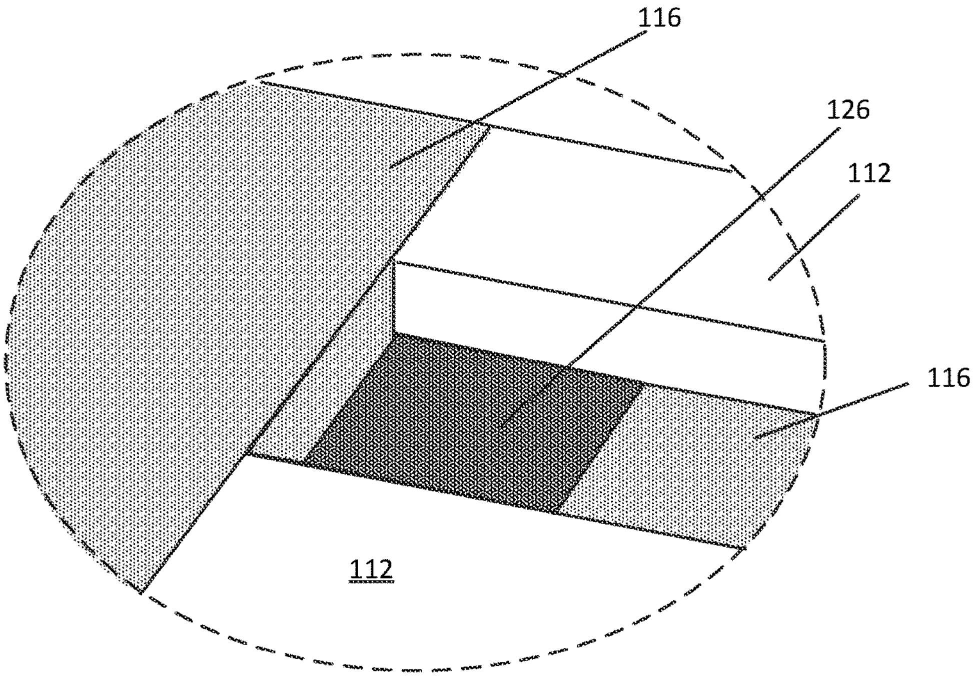
FIG. 15B illustrates an enlarged view of part of the layer stack shown circled in FIG. 15A, in accordance with an embodiment of the present disclosure.

Wordline processing 430 proceeds with patterning and etching 432 the top layer of passivation material 112 to expose the semiconductor material 126 of the transistors 120 and dummy material 116 in the uppermost tier 102 of the layer stack 104. FIG. 15A illustrates a perspective view of the layer stack 104 after etching 432 the passivation material 112. A region circled in broken lines in the right portion of FIG. 15A is shown enlarged in FIG. 15B to more clearly show the structure and materials.

Figure 16A:
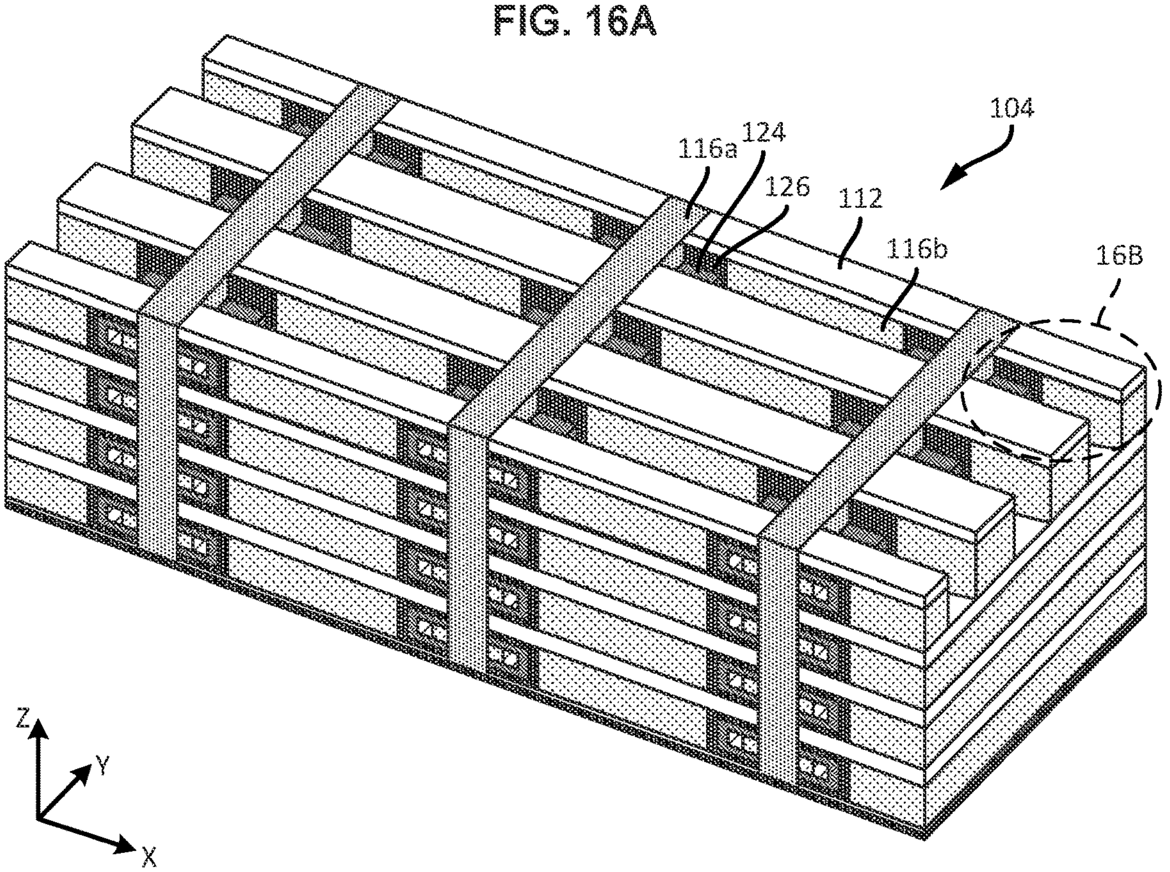
FIG. 16A illustrates the layer stack of FIG. 15A after recessing dummy material to expose wordline conductors with semiconductor material in the uppermost tier of the layer stack, in accordance with an embodiment of the present disclosure.
Figure 16B:
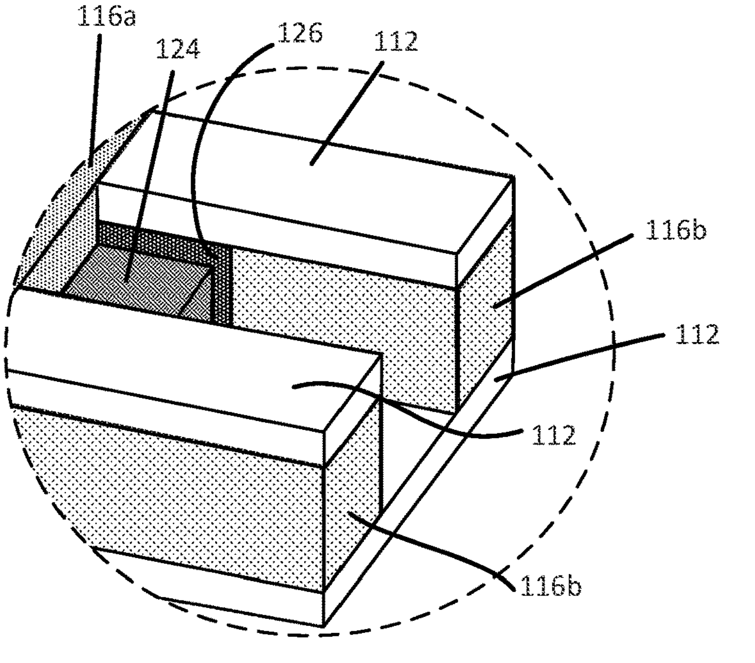
FIG. 16B illustrates an enlarged view of part of the layer stack shown circled in FIG. 16A, in accordance with an embodiment of the present disclosure.

Wordline processing 430 continues with etching 434 the dummy material 116*b* and etching 436 the semiconductor material 126 where exposed between the passivation material 112. In this process, the dummy material 116 in the bitline trenches 134 is not etched as the result of masking, or it is minimally etched by selecting an etch process selective to the dummy material 116*a* in the bitline trenches 134 and that is different from the dummy material 116*b* in the layer stack 104. Etching 434 the dummy material 116*b* exposes the semiconductor material 126 between regions of passivation material 112. Subsequently etching 343 the semiconductor material 126 removes the semiconductor material 126 in these regions and exposes the high-κ dielectric material 124 around the wordline conductor 122. FIG. 16A illustrates a perspective view of the layer stack 104 after etching 432 the dummy material 116*b* and semiconductor material 126 between regions of passivation material 112. A region circled in broken lines in the right portion of FIG. 16A is shown enlarged in FIG. 16B to more clearly show the structure and materials.

Figure 17A:
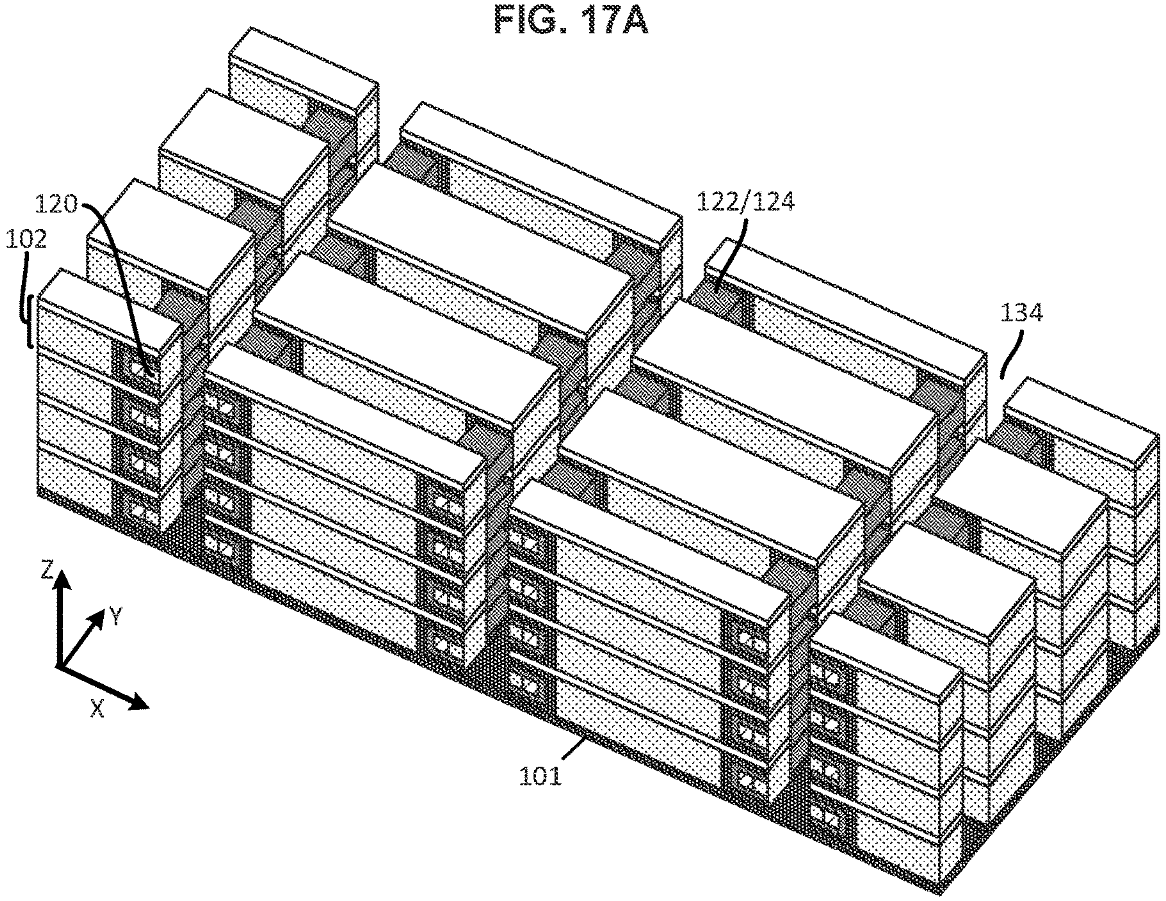
FIG. 17A illustrates a top perspective view of the layer stack of FIG. 16A after further processing, in accordance with an embodiment of the present disclosure.
Figure 17B:
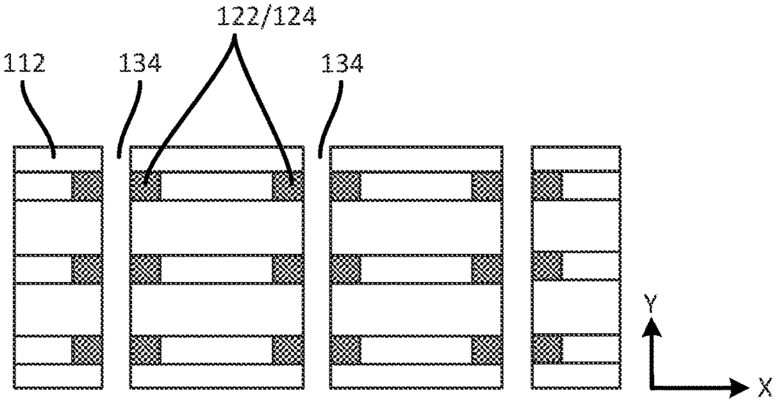
FIG. 17B illustrates a top view of the layer stack of FIG. 17A, in accordance with an embodiment of the present disclosure.
Figure 17C:
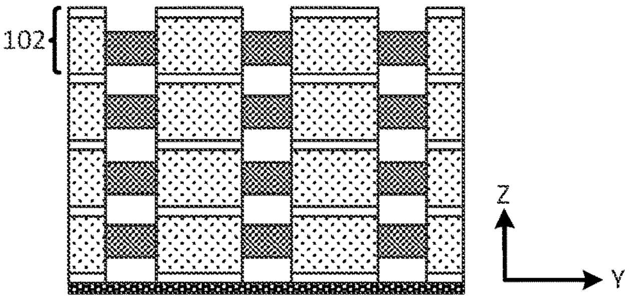
FIG. 17C illustrates a side view of the layer stack of FIG. 17A, in accordance with an embodiment of the present disclosure.

Processes 432, 434, and 436 are performed for each tier 102 of the layer stack 104. Referring to processes of method 400 shown in FIG. 4C, method 400 continues with etching 438 to remove dummy material 116*a* from the bitline trenches 134 in preparation for capacitor processing 440. FIG. 17A illustrates a perspective view of the layer stack 104 after wordline processing 430 and removing the dummy material 116*a* from the bitline trenches 134. FIG. 17B illustrates a top view and FIG. 17C illustrates an end view of the Y-Z plane of the layer stack 104 at the same stage of processing. In FIG. 17B, base layer 101 is not shown for clarity of illustration. At this stage of method, the layer stack 104 defines transistor 120 structures in each tier 102, a wordline conductor 122 extending in the Y-axis direction between transistors 120 in a given column of transistors 120, and open bitline trenches 134. In the top view of FIG. 17B, open spaces extend in the X-axis direction between some of the wordline conductors 122 (with high-κ dielectric material 124), and bitline trenches 134 are open between pairs of transistors 120. In the end view of 17C, wordline conductors 122 wrapped with high-κ dielectric 124 can be seen in each tier 102 extending between transistors, with open space above and below the wordline conductor 122 with high-κ dielectric 124.

Figure 18:
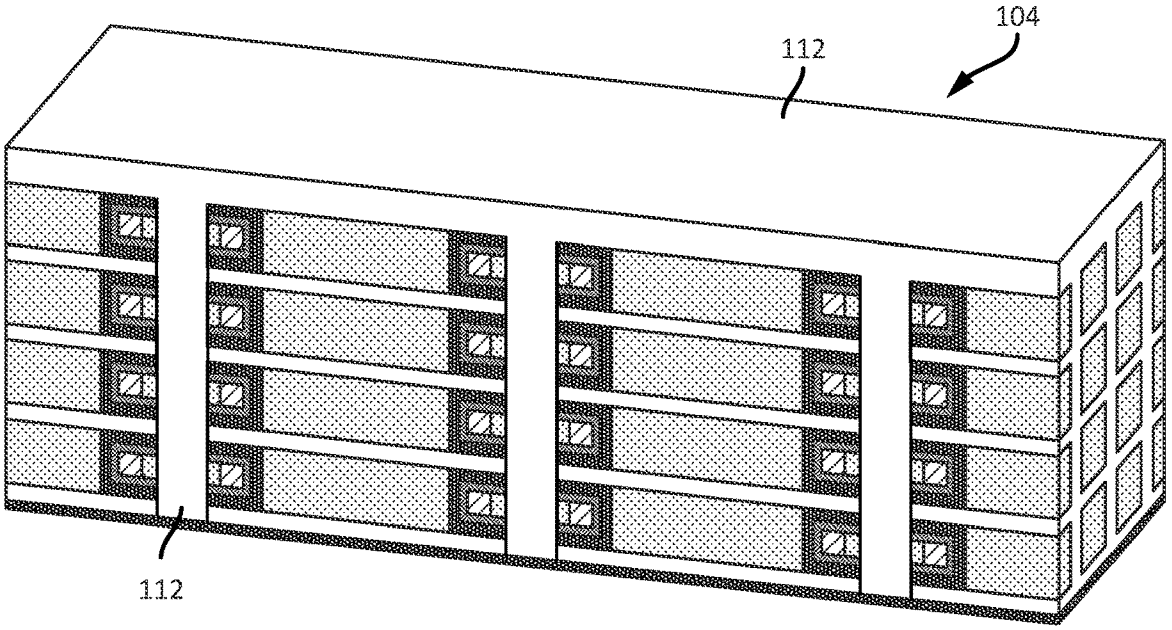
FIG. 18 illustrates the layer stack of FIG. 17A after filling with dummy material, in accordance with an embodiment of the present disclosure.

Method 400 continues with filling 442 the open regions of the layer stack 104 with a passivation material to isolate the existing structures during capacitor processing 440. FIG. 18 shows a perspective view of the layer stack 104 after filling 442 with passivation material 112. In this example, the passivation material 112 fills the bitline trenches 134 and other open spaces in the layer stack 104, and on top of the layer stack 104. The layer stack 104 optionally can be planarized using chemical-mechanical polishing (CMP).

Figure 19:
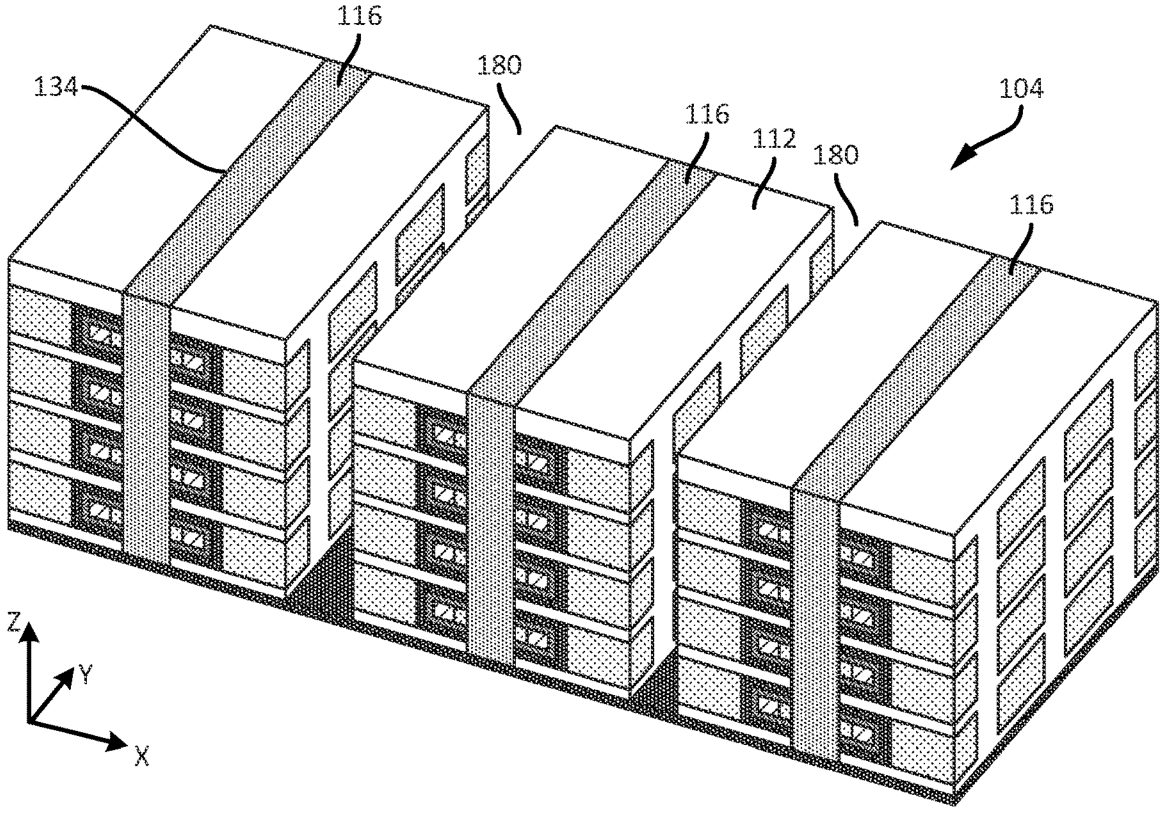
FIG. 19 illustrates the layer stack of FIG. 18 after defining trenches for capacitor processing, in accordance with an embodiment of the present disclosure.

Capacitor processing 440 proceeds with removing 444 the passivation material 112 from the bitline trenches 134 using an anisotropic etch, filling 446 the bitline trenches 134 with dummy material 116 such as an oxide, patterning and etching 444 the layer stack 104 to define conductor trenches 180 extending vertically through the layer stack 104 and extending in a Y-axis direction through the layer stack 104. Optionally, the layer stack 104 can be planarized after process 446 to remove dummy material 116 from the top layer of passivation material 112. FIG. 19 illustrates a perspective view showing the layer stack 104 with bitline trenches 134 filled with dummy material 116 and conductor trenches 180 defined between and extending parallel to the bitline trenches 134.

Figure 20:
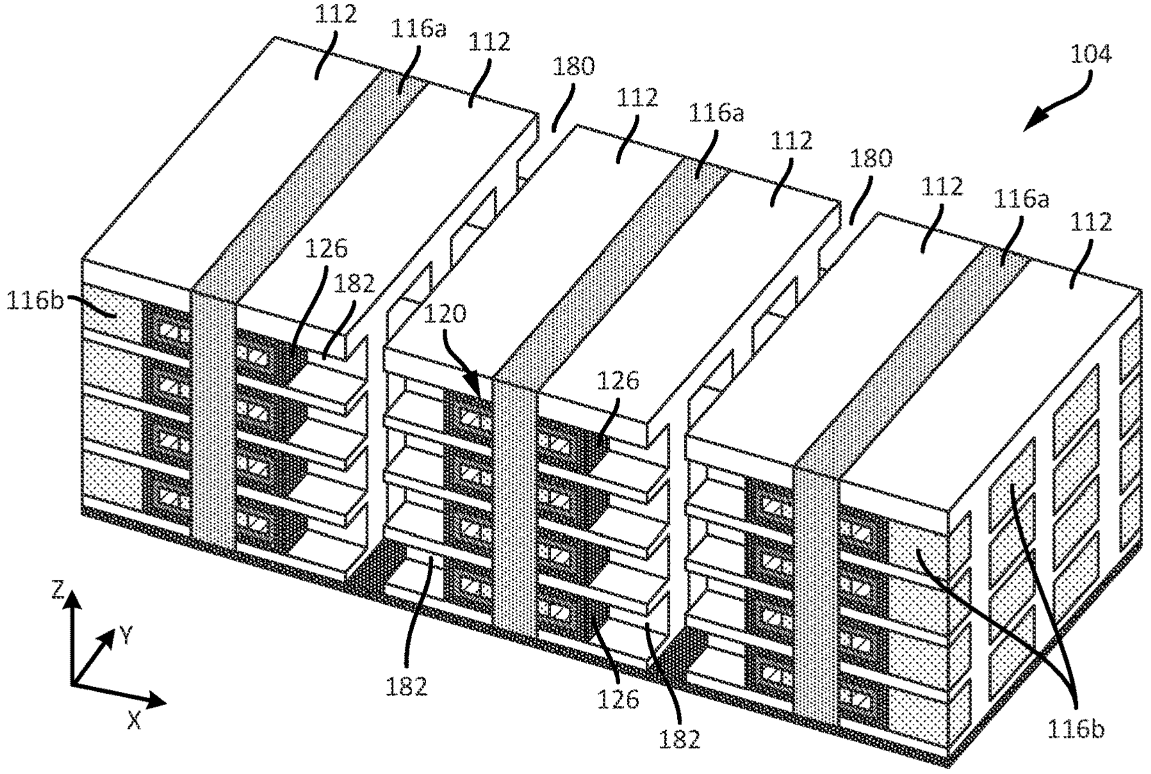
FIG. 20 illustrates the layer stack of FIG. 19 after recessing dummy material for capacitor processing, in accordance with an embodiment of the present disclosure.

Capacitor processing 440 continues with recessing 450 the dummy material in the layer stack 104 to expose part of the semiconductor material of the transistors. For example, an isotropic wet etch process can be used where the wet etchant enters the layer stack 104 via the conductor trenches 180. In one embodiment, the dummy material 116*a* in the bitline trenches 134 is masked to prevent it from etching. In another embodiment, the dummy material 116 in the bitline trenches 134 is compositionally distinct from the dummy material 116*b* in the layer stack 104 so as to provide etch selectivity. FIG. 20 illustrates a perspective view of the layer stack 104 after recessing 450 the dummy material 116*b* of the layer stack to expose part of the semiconductor material 126 of the transistors 120. Here, the exposed semiconductor material 126 includes a vertical face extending between vertically adjacent layers of passivation material 112. In this example, recessing 450 the dummy material 116*b* results in substantial or total removal of the dummy material 116*b* in regions accessible to the etchant. Note that in the example of FIG. 20, dummy material 116*b* remains at ends of the layer stack 104 where the etchant did not access this dummy material 116*b* since no conductor trench 180 is located there; however, etching a trench to expose the ends of the layer stack 104 can be performed as desired.

Capacitor processing 440 continues with depositing 452 the first conductor 172 of the capacitors 170. In one embodiment, the first conductor 172 is deposited 452 using atomic layer deposition, vapor deposition, or other suitable technique to provide a layer of conductor (e.g., metal) having substantially uniform thickness regardless of the surface orientation. The first conductor 172 is then removed from the capacitor trench.

Figure 21:
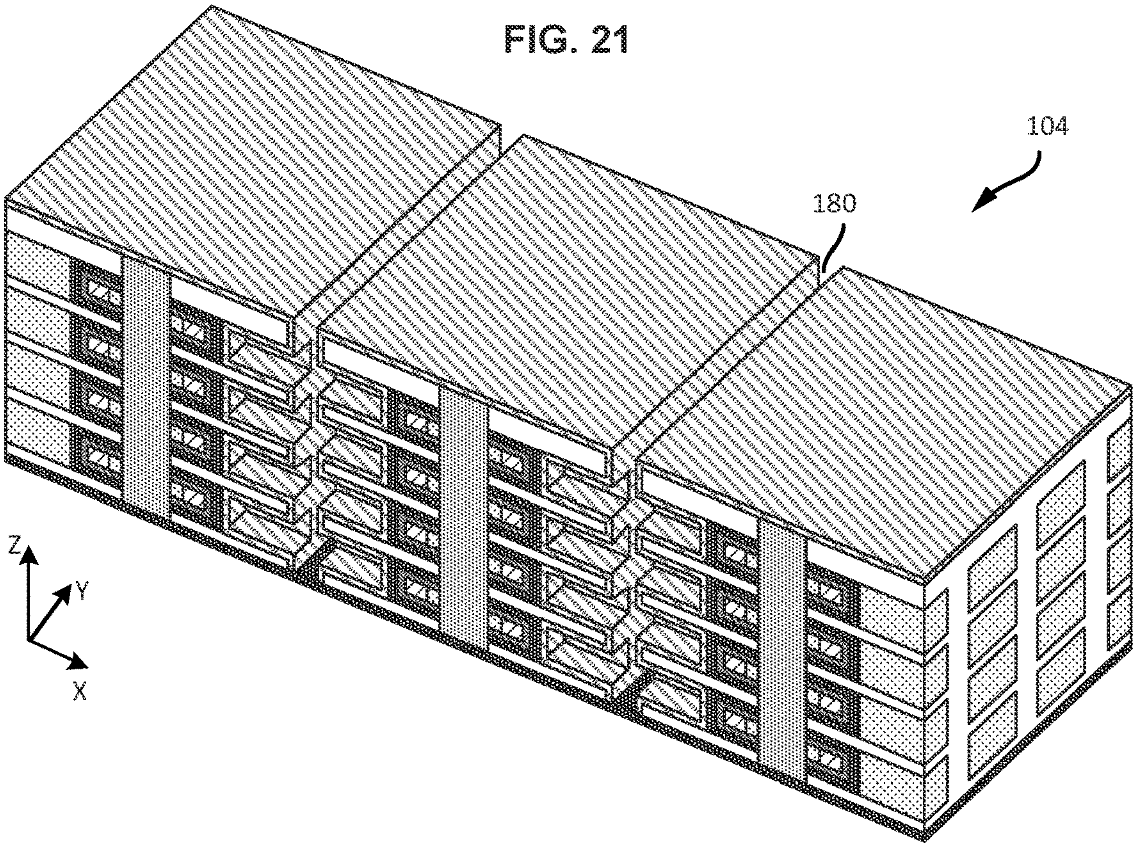
FIG. 21 illustrates the layer stack of FIG. 20 after depositing a layer of conductive material, in accordance with embodiment of the present disclosure.
Figure 22:
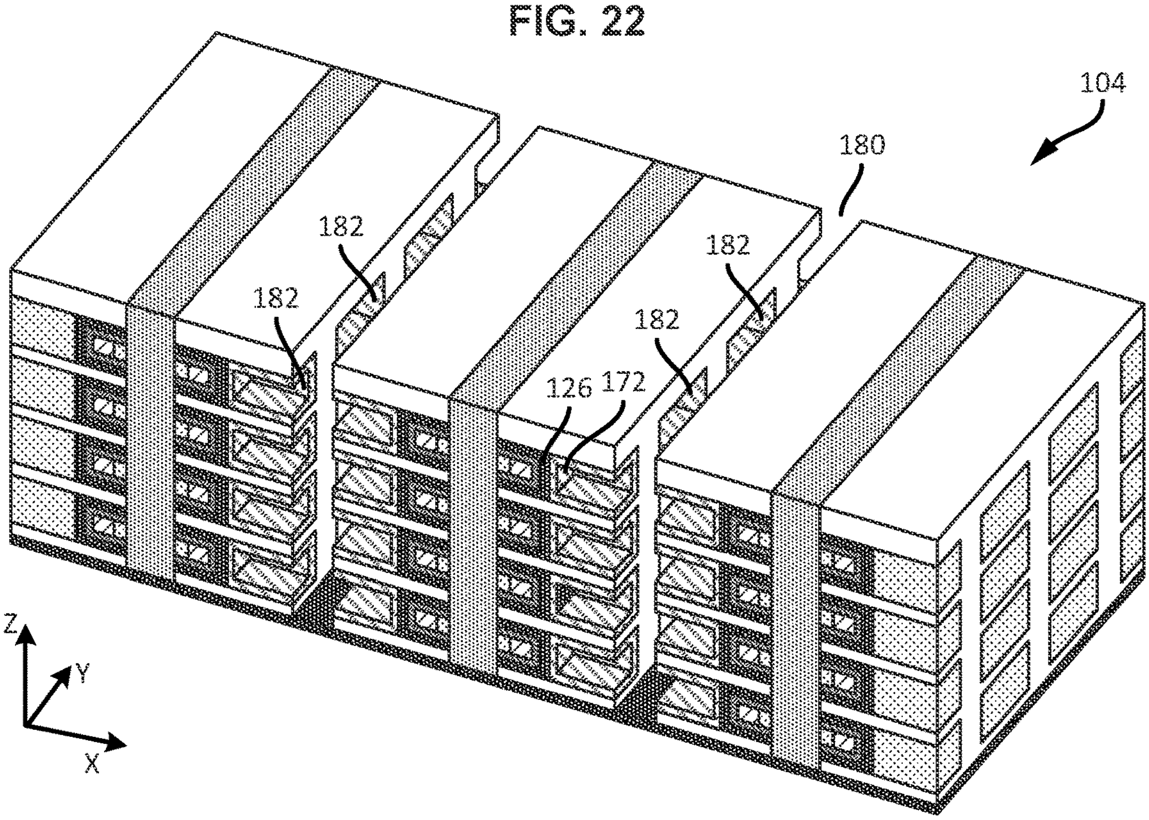
FIG. 22 illustrates the layer stack of FIG. 21 after removing the conductive material from the trench, in accordance with embodiment of the present disclosure.

FIG. 21 illustrates a perspective view of the layer stack 104 after depositing 452 the first conductor 172, but before removing the first conductor 172 from the capacitor trench 180. Note in FIG. 21 that the first conductor 172 has been deposited on all exposed surfaces. After depositing the first conductor 172, the conductor 172 can be etched to remove the first conductor 172 from the top of the layer stack 104 and sidewalls of the conductor trench 180, such as shown in the perspective view of FIG. 22. In FIG. 22, the first conductor occupies capacitor recesses 182 in the layer stack 104 and contacts the semiconductor material 126 exposed in process 450.

Figure 23:
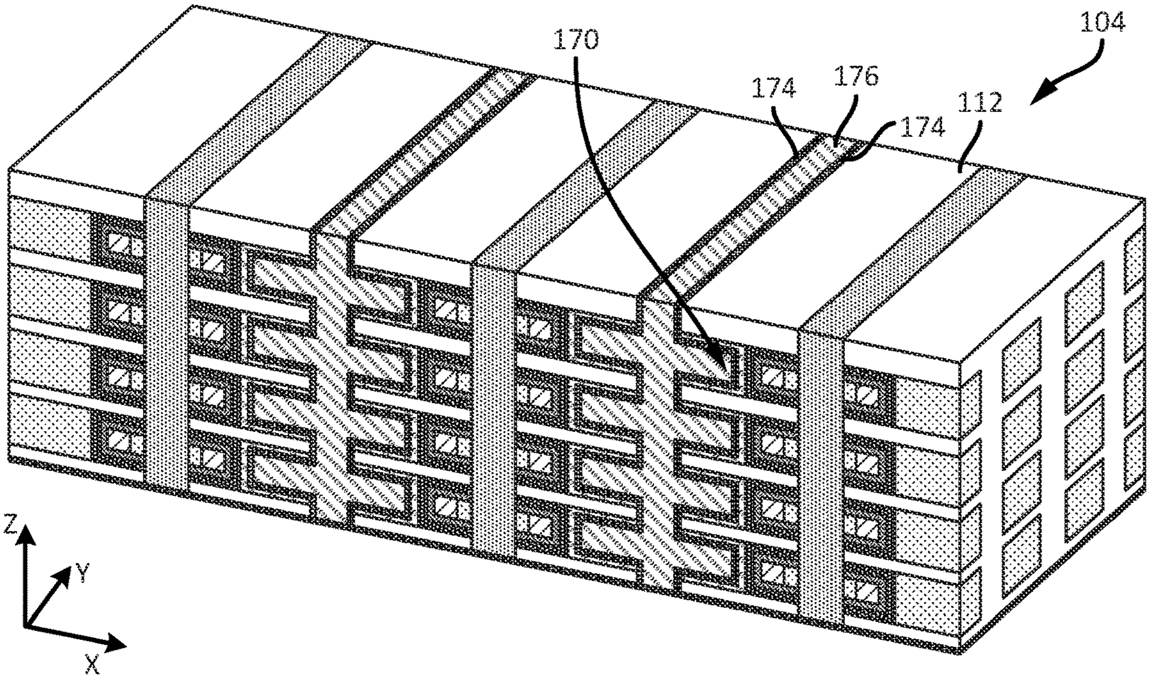
FIG. 23 illustrates the layer stack of FIG. 22 after depositing a layer of insulator and then a conductive material fill to define capacitor structures, in accordance with embodiment of the present disclosure.

Capacitor processing 440 continues with depositing 456 a layer of capacitor dielectric 174. Process 456 can be performed using atomic layer deposition or other suitable deposition technique. Capacitor processing 440 continues with depositing 458 the second conductor 176 (e.g., a metal) on the capacitor dielectric and filling the conductor trench 180 with the second conductor 176. Optionally, the second conductor 176 is deposited as a layer over the capacitor dielectric 174 and the conductor trench 180 is filled with a different conductor. The capacitor dielectric and second conductor can be removed from the top surface of the layer stack 104, such as using CMP, in preparation for bitline processing 160. FIG. 23 illustrates a perspective view of the layer stack 104 after processes 456 and 458 and shows the metal-insulator-metal (MIM) structure of the capacitors 170.

Figure 24:
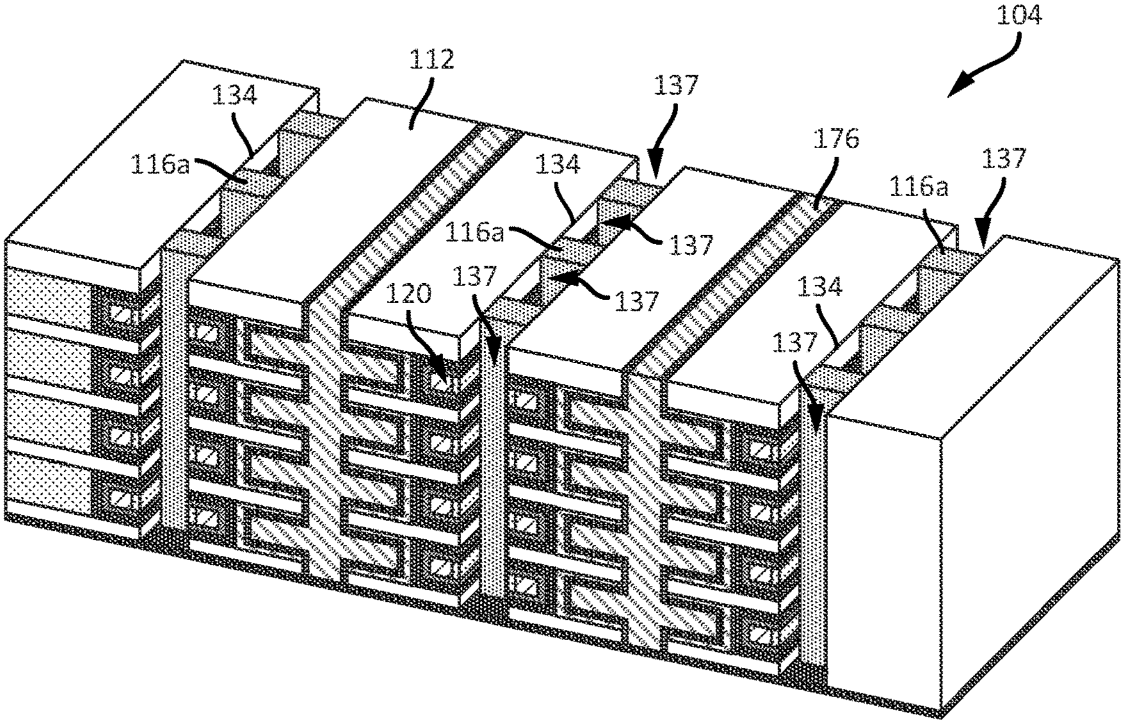
FIG. 24 illustrates the layer stack of FIG. 23 after defining vertical openings for bitline conductors, in accordance with embodiment of the present disclosure.

Bitline processing 460 proceeds with patterning and etching 462 the dummy material 116*a* for bitline conductors 130. In one embodiment, process 460 includes lithography and patterning to define openings over the dummy material 116*a* corresponding to vertical bitline conductors 130 aligned with transistors 120 along the Y-axis. The dummy material 116*a* can then be etched using an anisotropic etch process to define vertical openings for the bitline conductors 130. FIG. 24 illustrates the layer stack 104 after etching the dummy material 116*a* to define bitline conductor openings extending vertically in the layer stack 104.

Figure 25:
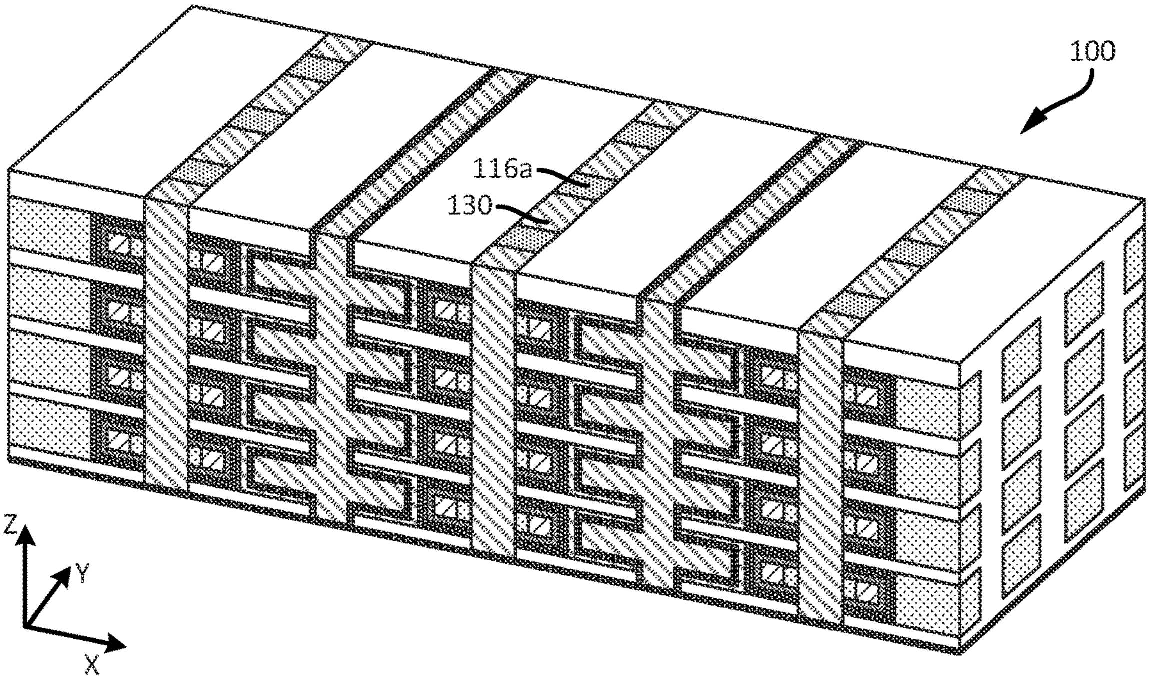
FIG. 25 illustrates the layer stack of FIG. 24 after filling the openings with conductive material, in accordance with embodiment of the present disclosure.

Bitline processing 460 continues with filling 464 the bitline conductor openings 137 with a suitable conductor, such as a metal. FIG. 25 illustrates a perspective view of a memory structure 100 formed from the layer stack 104 bitline processing 460.

Method 400 optionally continues with completing 470 a general integrated circuit (IC) as desired, in accordance with some embodiments. Such additional processing to complete 470 an IC may include back-end or back-end-of-line (BEOL) processing to form one or more metallization layers and/or to interconnect the bitline conductor, wordline conductor, and vertical conductor of the capacitors, for example. Any other suitable processing may be performed, as will be apparent in light of this disclosure

Example System

Figure 26:
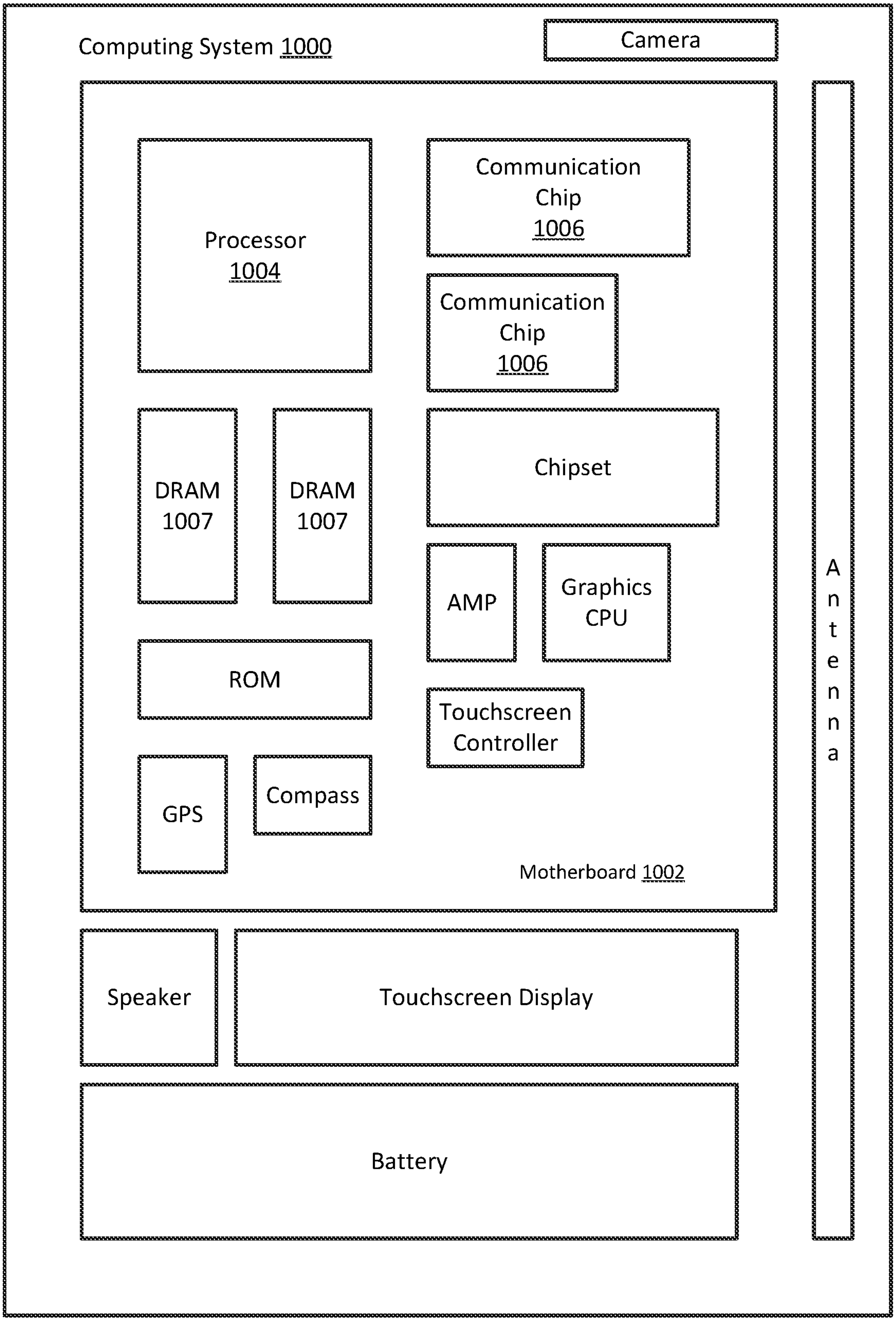
FIG. 26 illustrates an example computing system incorporating a 3D memory structure, in accordance with an embodiment of the present disclosure.

FIG. 26 is an example computing system implemented with one or more of the integrated circuit structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 can be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., to include one or more HBTs fabricated using a combination of epitaxial growth and LEO, as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term wireless and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistor structures having a gate stack an access region polarization layer as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term processor may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is a memory structure comprising a transistor including (i) a spacer between a bitline conductor and a first side of a wordline conductor, (ii) a semiconductor material including first and second portions extending from the bitline conductor horizontally along a top and a bottom of the spacer and wordline conductor, the semiconductor material further including a contact portion extending along an opposite second side of the wordline conductor between and connecting the first and second portions, and (iii) a high-κ dielectric between the semiconductor material and the wordline conductor; and a capacitor laterally adjacent the transistor, the capacitor comprising a first conductor abutting the contact portion of the semiconductor material, and a second conductor spaced from the first conductor by an insulator between the first and second conductors.

Example 2 includes the subject matter of Example 1 and further comprises the bitline conductor and the wordline conductor.

Example 3 includes the subject matter of any one of Examples 1 or 2, further comprising a ground terminal connected to the second conductor of the capacitor, wherein the second conductor of the capacitor and the ground terminal comprise a monolithic metal structure.

Example 4 includes the subject matter of any one of Examples 1-3, wherein the transistor and the capacitor are part of a memory cell, the memory structure further comprising a first layer of passivation material above the memory cell and a second layer of passivation material below the memory cell.

Example 5 includes the subject matter of any one of Examples 1-4, wherein the capacitor is a horizontal capacitor.

Example 6 includes the subject matter of any one of Examples 1-5, and further comprises the bitline conductor and the wordline conductor and the ground terminal, wherein the bitline conductor extends vertically, the wordline extends horizontally, and the ground terminal extends vertically.

Example 7 includes the subject matter of any one of Examples 1-6, wherein the semiconductor material comprises a group III-V semiconductor and/or a group IV semiconductor.

Example 8 includes the subject matter of any one of Examples 1-6, wherein the semiconductor material comprises a transition metal dichalcogenide.

Example 9 includes the subject matter of any one of Examples 1-8, wherein a contact area between the semiconductor material and the bitline conductor is smaller than a contact area between the semiconductor material and the first conductor of the capacitor.

Example 10 includes the subject matter of any one of Examples 1-9, wherein the memory structure is part of a dynamic random access memory (DRAM) structure.

Example 11 is a 3D memory structure comprising a plurality of tiers arranged in a vertical stack, individual tiers including an array of 1T-1C memory cells, an individual 1T-1C memory cell including a wordline conductor extending horizontally, a bitline conductor extending vertically, a spacer between a first side of the wordline conductor and the bitline conductor, a semiconductor material having first and second horizontal portions extending from the bitline conductor along a top and bottom of the wordline conductor and having a contact portion extending along a second side of the wordline conductor between and connecting the horizontal portions, a high-κ dielectric between the semiconductor material and the wordline conductor, and a capacitor having a first conductor, a second conductor, and an insulator between the first conductor and the second conductor, wherein the first conductor contacts the contact portion of the semiconductor material along the first side of the wordline conductor, and the second conductor connects to a ground terminal.

Example 12 includes the subject matter of Example 11, wherein the semiconductor material of the transistor structure provides a gated contact with the first conductor of the capacitor.

Example 13 includes the subject matter of any one of Examples 11 or 12, wherein pairs of capacitors are arranged substantially symmetrically about the ground terminal.

Example 14 includes the subject matter of any one of Examples 11-13, wherein laterally adjacent transistors are arranged substantially symmetrically about the bitline conductor.

Example 15 includes the subject matter of any one of Examples 11-14, wherein the second conductor of the capacitor and the ground terminal comprise a monolithic metal structure.

Example 16 includes the subject matter of any one of Examples 11-15, wherein individual memory cells comprise one horizontal dual-channel transistor and one horizontal capacitor.

Example 17 includes the subject matter of any one of Examples 11-16, wherein the plurality of tiers includes at least 8 tiers, or at least 16 tiers, or at least 32 tiers.

Example 18 includes the subject matter of any one of Examples 11-17 and further comprises a low-κ passivation material between tiers of the plurality of tiers.

Example 19 includes the subject matter of any one of Examples 11-18, wherein a contact area between the semiconductor material and the bitline conductor is smaller than a contact area between the semiconductor material and the first conductor of the capacitor.

Example 20 includes the subject matter of any one of Examples 11-19, wherein the memory structure is a dynamic random access memory structure.

Example 21 is a 3D memory structure comprising a plurality of tiers stacked vertically, individual tiers containing an array of memory cells, individual memory cells including one transistor structure and one capacitor; wordline conductors in each tier extending horizontally along a first horizontal axis and spaced along a second horizontal axis, wherein wordline conductors in the plurality of tiers are arranged spaced-apart in vertical stacks; a plurality of bitline conductors extending vertically, bitline conductors positioned between adjacent vertical stacks of wordline conductors, and spaced apart along the first horizontal axis; a plurality of transistors spaced apart along individual wordline conductors, individual transistors comprising a spacer between a first side of the wordline conductor and one of the plurality of bitline conductors, a dielectric and a semiconductor material extending along a top, a second side, and a bottom of one of the plurality of wordline conductors and the semiconductor material extending along a top and bottom of the spacer to the one of the plurality of bitline conductors, wherein the dielectric is between the semiconductor material and the wordline conductor; a capacitor laterally adjacent the transistor in an individual memory cell, the capacitor comprising a first conductor abutting the semiconductor material of the transistor, and a second conductor spaced from the first conductor by an insulator between the first and second conductors; and ground terminals electrically connecting the second conductor of a plurality of capacitors arranged in a vertical stack.

Example 22 includes the subject matter of Example 21 and further comprises a low-passivation material between adjacent tiers of the plurality of tiers.

Example 23 includes the subject matter of any one of Examples 21-22, wherein a contact area between the semiconductor material and the one of the plurality bitline conductors is smaller than a contact area between the semiconductor material and the first conductor of the capacitor.

Example 24 includes the subject matter of any one of Examples 21-23, wherein pairs of capacitors are arranged substantially symmetrically about the ground terminal.

Example 25 includes the subject matter of any one of Examples 21-24, wherein laterally adjacent transistors are arranged substantially symmetrically about the bitline conductor Example 26 is an integrated circuit including the memory structure of any one of Examples 1 through 25.

Example 27 is a microprocessor including the memory structure of any one of Examples 1 through 25.

Example 28 is a memory chip including the memory structure of any one of Examples 1 through 25.

Example 29 is a printed circuit board including the memory structure of any one of Examples 1 through 25, or the integrated circuit of Example 26, or the microprocessor of Example 27, or the memory chip of Example 28.

Example 30 is a computing system including the memory structure of any one of Examples 1 through 25, or the integrated circuit of Example 26, or the microprocessor of Example 27, or the memory chip of Example 28, or the printed circuit board of Example 29.

Example 31 is a method of fabricating a 3D memory structure, the method comprising providing a layered structure including alternating layers of passivation material and dummy material, wherein the passivation material and dummy material are selected for etch selectivity; defining bitline trenches extending vertically through the layered structure; recessing the dummy material laterally from the bitline trenches to define transistor recesses; defining transistors in the transistor recesses, individual transistors including a layer of semiconductor material along an inside of the transistor recesses and extending around three sides of a gate conductor, the individual transistors also including a layer of high-κ dielectric between the gate conductor and the layer of semiconductor material; depositing vertical conductors in the bitline trenches, individual vertical conductors in contact with the layer of semiconductor material in adjacent transistor recesses, the vertical conductors spaced from the gate conductor by the spacer material; etching capacitor trenches extending vertically through the layered structure, the capacitor trenches generally parallel to the bitline trenches and interleaved with the bitline trenches; recessing the dummy material laterally from the capacitor trenches to define capacitor recesses; and defining a horizontal capacitor in individual capacitor recesses, the horizontal capacitor including a first conductor abutting the semiconductor material and a second conductor isolated from the first conductor by an insulator.

Example 32 includes the subject matter of Example 31, wherein defining the transistors comprises depositing the layer of semiconductor material along an inside of the transistor recesses; depositing the layer of high-κ dielectric on the semiconductor material in the transistor recesses; forming a gate conductor in individual transistor recesses wherein the layer of high-κ dielectric is between the gate conductor and the layer of semiconductor material; and depositing spacer between the gate conductor and the bitline trench of individual transistor recesses.

Example 33 includes the subject matter of any one of Examples 31 or 32, wherein defining the horizontal capacitor comprises depositing a layer of the first conductor along an inside of the capacitor recesses and inside of the capacitor trenches, the first conductor abutting the layer of semiconductor material; depositing a layer of insulator on the first conductor layer; and depositing a second conductor on the layer of insulator, wherein the second conductor is isolated from the first conductor layer by the layer of insulator.

Example 34 includes the subject matter of any one of Examples 31-33, wherein defining the transistors includes defining a plurality of transistors along individual wordline conductors.

Example 35 includes the subject matter of any one of Examples 31-34, wherein depositing the second conductor includes filling the capacitor trenches with the second conductor.

Example 36 includes the subject matter of any one of Examples 31-35, wherein depositing the layer of semiconductor material includes selecting the semiconductor material comprising a group III-V semiconductor.

Example 37 includes the subject matter of any one of Examples 31-35, wherein depositing the layer of semiconductor material includes selecting the semiconductor material comprising a group IV semiconductor.

Example 38 includes the subject matter of any one of Examples 31-35, wherein depositing the layer of semiconductor material includes selecting the semiconductor material comprising a transition metal dichalcogenide.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. A memory structure comprising:

a transistor including a spacer comprising an electrically insulating material, the spacer being between a bitline conductor and a first side of a wordline conductor, the spacer being directly on the first side of the wordline conductor, a semiconductor material including first and second portions extending from the bitline conductor horizontally along a top and a bottom of the spacer and wordline conductor, the semiconductor material further including a contact portion extending along an opposite second side of the wordline conductor between and connecting the first and second portions, and a high-κ dielectric between the semiconductor material and the wordline conductor, the high-κ dielectric being separate from the spacer and around the spacer, the high-κ dielectric being directly on the opposite second side of the wordline conductor; and a capacitor laterally adjacent the transistor, the capacitor comprising a first conductor abutting the contact portion of the semiconductor material, and a second conductor spaced from the first conductor by an insulator between the first and second conductors.

2. The memory structure of claim 1, wherein the bitline conductor extends between adjacent memory cells of the memory structure, and the wordline conductor extends between adjacent memory cells of the memory structure.

3. The memory structure of claim 1, further comprising a ground terminal connected to the second conductor of the capacitor, wherein the second conductor of the capacitor and the ground terminal comprise a monolithic metal structure.

4. The memory structure of claim 1, wherein the transistor and the capacitor are part of a memory cell, the memory structure further comprising a first layer of passivation material above the memory cell and a second layer of passivation material below the memory cell.

5. The memory structure of claim 4, wherein the capacitor is a horizontal capacitor.

6. The memory structure of claim 5, further comprising a ground terminal, wherein the bitline conductor extends vertically, the wordline conductor extends horizontally, and the ground terminal extends vertically.

7. The memory structure of claim 1, wherein the semiconductor material comprises a group III-V semiconductor and/or a group IV semiconductor.

8. The memory structure of claim 1, wherein the semiconductor material comprises a transition metal dichalcogenide.

9. The memory structure of claim 1, wherein a contact area between the semiconductor material and the bitline conductor is smaller than a contact area between the semiconductor material and the first conductor of the capacitor.

10. The memory structure of claim 1, wherein the memory structure is part of a dynamic random access memory (DRAM) structure.

11. A 3D memory structure comprising:

a plurality of tiers arranged in a vertical stack, individual tiers including an array of 1T-1C memory cells, an individual 1T-1C memory cell including a wordline conductor extending horizontally, a bitline conductor extending vertically, a spacer comprising an electrically insulating material, the spacer being between a first side of the wordline conductor and the bitline conductor, the spacer being directly on the first side of the wordline conductor, a semiconductor material having first and second horizontal portions extending from the bitline conductor along a top and bottom of the wordline conductor and having a contact portion extending along a second side of the wordline conductor between and connecting the horizontal portions, a high-κ dielectric between the semiconductor material and the wordline conductor, the high-κ dielectric being separate from the spacer and around the spacer, the high-κ dielectric being directly on the second side of the wordline conductor, and a capacitor having a first conductor, a second conductor, and an insulator between the first conductor and the second conductor, wherein the first conductor contacts the contact portion of the semiconductor material along the first side of the wordline conductor, and the second conductor connects to a ground terminal.

12. The 3D memory structure of claim 11, wherein the second conductor of the capacitor and the ground terminal comprise a monolithic metal structure.

13. The 3D memory structure of claim 11, further comprising a low-K passivation material between tiers of the plurality of tiers.

14. The 3D memory structure of claim 11, wherein a contact area between the semiconductor material and the bitline conductor is smaller than a contact area between the semiconductor material and the first conductor of the capacitor.

15. The 3D memory structure of claim 11, wherein the memory structure is a dynamic random access memory structure.

16. A 3D memory structure comprising:

a plurality of tiers stacked vertically, individual tiers containing an array of memory cells, individual memory cells including one transistor structure and one capacitor;

wordline conductors in each tier extending horizontally along a first horizontal axis and spaced along a second horizontal axis, wherein wordline conductors in the plurality of tiers are arranged spaced-apart in vertical stacks;

a plurality of bitline conductors extending vertically, bitline conductors positioned between adjacent vertical stacks of wordline conductors, and spaced apart along the first horizontal axis;

a plurality of transistors spaced apart along individual wordline conductors, individual transistors having a spacer comprising an electrically insulating material, the spacer being between a first side of the wordline conductor and one of the plurality of bitline conductors and the spacer being directly on the first side of the wordline conductor, a dielectric and a semiconductor material extending along a top, a second side, and a bottom of one of the plurality of wordline conductors and the semiconductor material extending along a top and bottom of the spacer to the one of the plurality of bitline conductors, wherein the dielectric is between the semiconductor material and the wordline conductor, and wherein the dielectric is separate from the spacer and is around the spacer, and wherein the dielectric is directly on the second side of the wordline conductor;

a capacitor laterally adjacent the transistor in an individual memory cell, the capacitor comprising a first conductor abutting the semiconductor material of the transistor, and a second conductor spaced from the first conductor by an insulator between the first and second conductors; and ground terminals electrically connecting the second conductor of a plurality of capacitors arranged in a vertical stack.

17. The 3D memory structure of claim 16, further comprising a low-K passivation material between adjacent tiers of the plurality of tiers.

18. The 3D memory structure of claim 16, wherein a contact area between the semiconductor material and the one of the plurality bitline conductors is smaller than a contact area between the semiconductor material and the first conductor of the capacitor.

19. The 3D memory structure of claim 16, wherein pairs of capacitors are arranged substantially symmetrically about the ground terminal.

20. The 3D memory structure of claim 16, wherein laterally adjacent transistors are arranged substantially symmetrically about the bitline conductor.

* * * * *